(12) United States Patent
Magome

(10) Patent No.: US 6,320,195 B1
(45) Date of Patent: Nov. 20, 2001

(54) EXPOSURE APPARATUS, METHOD OF MAKING THE APPARATUS, EXPOSURE METHOD, AND DEVICE AND MANUFACTURING METHOD OF THE DEVICE

(75) Inventor: Nobutaka Magome, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/604,044

(22) Filed: Jun. 26, 2000

Related U.S. Application Data

(63) Continuation of application No. PCT/JP98/05987, filed on Dec. 28, 1998.

(30) Foreign Application Priority Data

Dec. 26, 1997 (JP) .................................................... 9-368302

(51) Int. Cl.$^7$ .................................................... H01J 37/00
(52) U.S. Cl. .................................................... 250/442.11
(58) Field of Search ........................... 250/492.2, 442.11, 250/440.11

(56) References Cited

U.S. PATENT DOCUMENTS

| 5,528,118 | * | 6/1996 | Lee .................................. 318/568.17 |
| 5,852,298 | * | 12/1998 | Hatakeyama et al. ............ 250/492.2 |
| 6,072,183 | * | 6/2000 | Itoh et al. ....................... 250/442.11 |

FOREIGN PATENT DOCUMENTS

| 1-227436 | 9/1989 | (JP) . |
| 3-257170 | 11/1991 | (JP) . |
| 4-33326 | 2/1992 | (JP) . |

\* cited by examiner

*Primary Examiner*—Kiet T. Nguyen
(74) *Attorney, Agent, or Firm*—Oblon, Spivak, McClelland, Maier & Neustadt, P.C.

(57) ABSTRACT

An exposure apparatus comprising a charged particle beam barrel movable parallel with a wafer for exposing a two-dimensional region (XY-two-dimensional region) of the wafer to a charged particle beam. The exposure can be performed by moving the charged particle beam barrel XY-two-dimensionally even if the wafer holder is fixed. Therefore, the footprint of the exposure apparatus is reduced to ¼ compared to conventional apparatus in which the charged particle beam barrel is fixed and wafer holder is two-dimensionally movable.

37 Claims, 9 Drawing Sheets

EXPOSURE APPARATUS, METHOD OF MAKING THE APPARATUS, EXPOSURE METHOD, AND DEVICE AND MANUFACTURING METHOD OF THE DEVICE

CROSS-REFERENCE TO RELATED APPLICATIONS

This is a continuation of International Application PCT/JP98/05987, with an international filing date of Dec. 28, 1998, the entire content of which is hereby incorporated by reference.

BACKGROUND OF THE INVENTION

1. Field of the Invention

The present invention relates to an exposure apparatus, a method of making the apparatus, an exposure method, and a device and a manufacturing method of the device. More particularly, the invention relates to an exposure apparatus used in a lithographic process, a method of making the apparatus, an exposure method used in a lithographic process, and a device manufactured by the use of the exposure method, and a manufacturing method of the device.

2. Description of the Related Art

Various exposure apparatus are conventionally used in a lithographic process for the manufacture of micro-devices such as integrated circuits. As this exposure apparatus, an optical exposure apparatus such as a step-and-repeat type reducing projection exposure apparatus (known as a stepper) is mainly used. Though within a limited range of fields, there is also utilized a charged particle beam exposure apparatus performing exposure by the use of a charged particle beam such as an electron beam or an ion beam for forming an extra-fine circuit pattern on a substrate such as a wafer. An electron beam exposure apparatus (known also as an EB exposure apparatus) is a typical example of the charged particle beam exposure apparatus.

FIG. 9 schematically illustrates an example of the conventional electron beam exposure apparatus. The electron beam exposure apparatus 110 shown in FIG. 9 comprises a base plate 103 horizontally supported on a plurality of vibration isolators 102, a vacuum chamber 104 of a high degree of vacuum provided adjacent to the base plate 103, a pre-stage chamber of a slightly lower degree of vacuum than in the vacuum chamber 104, an electron beam barrel 108 fixed to an upper portion of the vacuum chamber 104 and having the lower end thereof inserted into the vacuum chamber 104, and a stage 106 housed in the vacuum chamber 104 and moving two-dimensionally while holding a wafer W on the base plate 103.

In this apparatus, it is possible to change the irradiation point on the wafer W by a slight amount by deflecting the electron beam EB emitted from an electron gun 109 and to the right by means of a deflection electrode (not shown in Figs.). A large change of the irradiation point of the electron beam EB relative to the wafer W has however been accomplished through two-dimensional movement of the stage 106.

In the conventional electron beam exposure apparatus, a medium-acceleration type electron beam barrel accelerating an electron beam by a voltage within a range of 30 to 50 kV has mainly been used, taking into account the thickness and the sensitivity of the resist layer used. When carrying out exposure with such a medium-acceleration type electron gun barrel, however, it is necessary to conduct ghost exposure (double exposure) to avoid an adverse effect of back scattered electron, and a Coulomb blur has caused a decrease in resolution.

For the purpose of solving these problems, an electron beam exposure apparatus was recently developed, which eliminated the necessity of the above-mentioned ghost exposure, and particularly, adopted an electron beam barrel performing high-voltage (for example, 50 to 100 kV) acceleration to prevent a decrease in resolution caused by the Coulomb blur and improve the throughput. With such an apparatus, however, the exposing efficiency of the resist relative to the energy necessary for acceleration of the electron beam is reduced to a lower level than in the use of medium-acceleration electron beam. The electron beam barrel is required to be larger, to such a level that the height reaches a value within a range of 150 to 200 cm.

In the conventional electron beam exposure apparatus, as described above, a structure in which a wafer stage making a two-dimensional movement was adopted because of the necessity to adopt a large-scale electron beam barrel including the case of the medium acceleration. With this apparatus, however, the footprint (floor area occupied by the apparatus) of the main body of the apparatus becomes larger along with the tendency toward a large diameter of wafers. More specifically, in order to achieve exposure of the entire surface of a wafer in an apparatus of this type, the stage must provide a movement stroke twice as large as the wafer diameter. In order to expose the entire surface of a 12-inch wafer(a wafer having a diameter of 300 mm), which is likely to become available in the near future, the stage must have a stroke of at least ±300 mm around the barrel, as a result the footprint requires over 600 mm square. Actually, it is necessary to provide a vacuum chamber and a wafer introduce/removal mechanism, resulting in a scale twice as large.

In the electron beam exposure apparatus, the exposing speed is lower compared with the optical exposure apparatus. That is, the number of wafers capable of being fabricated in a unit time is small. As a result, when carrying out exposure in the mix-and-match manner with an optical exposure apparatus, i.e., when exposing a layer by optical means and exposing another layer with an electron beam, it becomes necessary to use electron beam exposure apparatus in a number several times as large as that of optical exposure apparatus. For example, while an optical exposure apparatus can expose 80 12-inch wafers per hour, a high-acceleration electron beam exposure apparatus has a throughput of only about five to ten wafers per hour. In order to achieve the same throughput, electron beam exposure apparatus in a number even eight times as large as that of an optical exposure apparatus are necessary. If, in the case, an optical exposure apparatus and an electron beam exposure apparatus are designed with a same concept, and the footprint is designed to be equal between the two, the electron beam exposure apparatus may require a larger footprint due to the area occupied by a vacuum chamber. This result in the necessity of a very large clean room, leading to a very high cost.

SUMMARY OF THE INVENTION

The present invention was developed under the circumstances as described above, and has an object to provide an exposure apparatus and an exposure method, which permit reduction of the footprint.

A lower acceleration voltage to a charged particle beam leads in general to a higher response of a resist and a shallower resist penetration depth. The resist film on an object to be exposed is therefore limited to thinner ones. Therefore, in order to use a low-acceleration charged particle beam while keeping a resist film thickness necessary for a conventional manufacturing process of semiconductor devices, it has so far been necessary to adopt a special resist such as a surface-reactive resist or the double-layer resist method. When such a process is adopted, the resist coating step has caused a cost problem. In the conventional charged particle beam exposure apparatus, therefore, a medium-acceleration or a high-acceleration charged particle beam barrel has been employed. Recently, however, improvement of the process technology (wafer flattening technique) is making it possible to reduce the film thickness, even with the use of an ordinary resist by flattening the wafer surface by the application of, for example, CMP (chemical & mechanical polishing). As a result, the use of a low-acceleration charged particle beam barrel with a high resist response performance has become a practical choice. In the case of an electron beam exposure apparatus, the progress made in the resist technology now makes it possible to use a low-acceleration electron beam barrel even when the film is somewhat thick. The low-acceleration charged particle beam barrel can easily be downsized and made movable. The present invention was developed with these points in view.

According to a first aspect of the invention, there is provided an exposure apparatus comprising a substrate holder holding a substrate; and a charged particle beam barrel movable along a plane parallel to the surface of the substrate to expose the substrate by irradiating a charged particle beam onto the substrate. According to this aspect of the invention, since the apparatus has a charged particle beam barrel movable along a plane parallel to the substrate surface to expose the substrate by irradiating onto the substrate, it is possible to expose the substrate by moving the charged particle beam barrel, even when, for example, the substrate holder is kept in a fixed state. As compared with the conventional exposure apparatus in which the charged particle beam barrel is fixed and the substrate holder is movable, therefore, it is possible to reduce the size of the footprint of the apparatus. The reason is as follows. When the substrate holder side is movable, a moving stroke of the stage twice as large as the diameter of the substrate is required (for both the X and Y directions) Compared with this, when the charged particle beam barrel side is movable, a moving stroke suffices to be of the same order as the substrate diameter (for each of the X and Y directions).

In this case, the path from the charged particle beam barrel side to the substrate may be in vacuum. Actually, however, it is difficult to form such a vacuum path, and when the path is not in vacuum, collision of charged particle beams with air molecules in the path causes scattering. The apparatus should therefore preferably further comprise vacuum chamber housing at least a part of the charged particle barrel and the substrate holder. In this case, the charged particle beam can be effectively irradiated onto a target irradiation point on the substrate by a simple method.

According to the exposure apparatus of the present invention, it is possible to expose a two-dimensional region on the substrate by the usage of the charged particle beam. With this apparatus, even when the substrate holder is kept in a fixed state, it is possible to expose the entire area of the exposure range on the substrate by causing the charged particle beam barrel to conduct two dimensional movement (XY two-dimensional movement) over substantially the entire area of the exposure range on the substrate. In this case, a moving stroke of the charged particle beam barrel (in each of the X and Y directions) suffices to be approximately the same length as the substrate diameter, resulting in a moving range of one fourth within a two-dimensional plane, compared with the range of the substrate holder side moving. Consequently, it is possible to reduce the footprint of the exposure apparatus to about a fourth.

Even when the moving stroke of the charged particle beam in the X direction or the Y direction is shorter than the substrate diameter, it is possible even to expose the entire exposure range on the substrate by moving the charged particle beam barrel and the substrate holder. In this case also, it is possible to reduce the footprint of the exposure apparatus, although the decrement ratio differs with the moving stroke of the charged particle beam barrel.

When the exposure apparatus of the invention has a movable substrate holder, it should preferably further comprise a base on which the substrate holder is placed, and a vibration isolator on which the base is arranged. In such a case, since the vibration isolator causes attenuation of vibration propagating from outside via the floor surface, it is possible to reduce vibration in the substrate holder. Because passing of a reaction force acting on the base under the effect of movement of the substrate holder to the surrounding members is prevented by the vibration isolator, it is possible to prevent occurrence of vibration in the surrounding members. It is therefore possible to improve the throughput as a result of improvement of the exposure accuracy and reduction of settling time.

It is needless to mention that, in the exposure apparatus of the invention, the substrate may be fixed and the charged particle beam barrel may conduct two-dimensional movement relative to the substrate. The substrate holder may be movable in a first direction (for example, Y direction) and the charged particle beam barrel may be movable at least in a second direction (for example, X direction) perpendicular to the first direction in parallel with the surface of the substrate. In this case, the moving stroke of the charged particle beam barrel in the second direction is about a half the conventional stroke, consequently, it is possible to reduce the footprint of the exposure apparatus to about a half.

In this case, the advantages are available of course with the apparatus having the same vacuum chamber as above. The exposure apparatus may also further comprise a vacuum chamber which houses the substrate holder and a part of the charged particle beam barrel, and the vacuum chamber may partially comprise bellows-type members expanding and contracting in response to movement of the charged particle beam barrel. In such a case, since the charged particle beam barrel is not completely housed in the vacuum chamber, the inner volume of the vacuum chamber can be smaller, and the evacuation time can be accordingly reduced with a vacuum pump of a smaller capacity. Because a portion of the vacuum chamber comprises bellows-type members expanding and contracting in response to movement of the charged particle beam barrel, movement of the charged particle beam barrel in the second direction is not interfered.

The exposure apparatus of the invention may further comprise pedestals on which the charged particle beam barrel is arranged and a vibration attenuator arranged between the pedestals and the installation surface of the substrate holder. In this case, vibration on the pedestal side produced by a reaction to the thrust for moving the charged particle beam barrel upon movement thereof is attenuated by the vibration attenuator travelling to the installation surface of the substrate holder. The substrate holder is therefore, almost free from the influence of the movement of the charged particle beam barrel. This eliminates the risk of the irradiation point on the substrate of the charged particle beam from the charged particle beam deviating under the effect of vibration of the substrate holder, thus permitting accurate irradiation of the charged particle beam onto a desired position on the substrate.

In this configuration, the vibration attenuator may be arranged on the installation surface, and a first vibration isolator supporting the pedestal may be provided. In such a case, since vibration travelling from outside via the installation surface is attenuated by the first vibration isolator, it is possible to reduce vibration travelling from outside via the installation to the charged particle beam barrel. Because vibration of the pedestal caused by the reaction force acting on the pedestal during movement of the charged particle beam barrel is attenuated by the first vibration isolator when it travels to the installation surface, it is possible to reduce vibration affecting other members composing the exposure apparatus.

The exposure apparatus provided with the vibration attenuator having the first vibration isolator may further comprise a second vibration isolator on which the substrate holder is arranged, and in this configuration, the first vibration isolator may be arranged flush with the installation surface of the second vibration isolator. In such a case, vibration, which travels through the floor surface is attenuated by the second vibration isolator, which makes it possible to reduce vibration in the substrate holder. Vibration, which travels to the substrate holder in accordance with the movement of the charged particle beam barrel, is attenuated by the first vibration isolator, and then further attenuated by the second vibration isolator.

The effect exerted on the substrate holder by the movement of the charged particle beam barrel is, therefore, further reduced. When the substrate holder is movable, vibration which travel to the installation surface due to the movement of the substrate holder is reduced by the second vibration isolator. This can reduce vibration in the other members composing the exposure apparatus. Because vibration travelling to the charged particle beam barrel with the movement of the substrate holder is attenuated in the second vibration isolator, and further reduced by the first vibration isolator, the charged particle beam barrel is almost free from the effect of the movement of the substrate holder.

The exposure apparatus of the invention may further comprise a vacuum chamber which houses at least a part of the charged particle beam barrel and the substrate holder, and the installation surface of the substrate holder may differ from the installation surface of the vacuum chamber. In this configuration, since the path of the charged particle beam can be in vacuum, scattering of the charged particle beam caused by collision of air molecules with charged particle beam is reduced, and at the same time, it is possible to prevent travelling of vibration caused by the movement of the substrate holder to the vacuum chamber.

The exposure apparatus of the invention may further comprise a pedestal on which the charged particle beam barrel is arranged; and a vibration attenuator which offsets a reaction force produced in the pedestal in response to movement of the charged particle beam barrel. In this case, vibration of the pedestal caused from the reaction force of thrust causing movement of the charged particle beam barrel during movement thereof is attenuator by the vibration attenuator, thus making it possible to reduce vibration in the other members composing the exposure apparatus.

In this configuration, the vibration attenuator may have a structure movable is response to movement of the charged particle beam barrel. In this case, because reaction force of the thrust for moving the charged particle beam is absorbed by moving the structure in match with movement of the charged particle beam barrel. It is possible to reduce vibration in the other member composing the exposure apparatus.

The exposure apparatus of the invention may further comprise a vibration isolator on which the substrate holder is arranged. The vibration attenuator is arranged substantially flush with the installation surface of the vibration isolator and has an actuator having an end connected to the pedestal. In such a case, vibration travelling from outside via the installation surface to the substrate holder, and vibration travelling to the other members caused by the movement of the substrate holder are attenuated by the vibration isolator. Simultaneously with this, vibration travelling to the other members caused by the movement of the charged particle beam barrel is reduced by imparting a force to the pedestal by means of an actuator and by moving the charged particle beam barrel, to offset the reaction force of the thrust.

Another configuration may be adopted, in which the pedestal is provided on the base on which the substrate holder is arranged.

The exposure apparatus of the invention may further comprise an interferometer system, which detects positional information of the charged particle beam barrel. In this case, it is possible to accurately position the substrate and the charged particle beam barrel on the basis of accurate position and posture of the charged particle beam barrel which is detected by the interferometer system. It is therefore possible to perform exposure of the substrate at a high accuracy. Because the position and posture of the charged particle beam barrel can be accurately detected, exposure can be performed based on the results. For example, by controlling the amount of the deflection of the charged particle beam, exposure can be performed without waiting for the lapse of a setting time after the movement of the charged particle beam barrel. It is accordingly possible to improve throughput of exposure.

In the exposure apparatus, it is of course possible to use an ion beam barrel, for example, as the charged particle beam barrel. An electron beam barrel irradiating an electron beam to the substrate may be adopted as the charged particle beam barrel. An applicable electron beam barrel is a medium-acceleration type or a high-acceleration type electron beam barrel of an acceleration voltage of at least 30 kV. With such a barrel, however, the large-scale electron beam barrel results in larger supporting members supporting the same, requiring a large-sized driving unit for driving the same, resulting in a larger-scale equipment. Therefore, the acceleration voltage of the electron beam should preferably be within a range of at least 500V to under 30 kV, and more preferably be within a range of at least 5 kV up to 20 kV. With such an acceleration voltage, it is possible to use a compact electron beam barrel, thus permitting the use of a very small driving unit. With a low-acceleration electron beam, the resist sensitivity on the substrate becomes higher, and absence of proximity effect caused by a back scatter (back scattering electron) eliminates the necessity of a high-leveled correction, such as the correction of the current amount or correction of a mask pattern. This provides a favorable merit in that the burden of generating control data for controlling electron beam is greatly reduced.

Various types of electron beam barrel are applicable as the electron beam barrel described above. It is possible to use one selected from the group consisting of Gaussian beam type, variable forming beam type, cell projection type, blanking aperture array type, and electron beam projecting system (hereinafter abbreviated as "EBPS") type or any arbitrary combination of the above.

The exposure apparatus of the invention may have a configuration in which rotation of the charged particle beam barrel is detected. In this case, a high-accuracy exposure can be performed by correcting the irradiating position of the charged particle beam in respect to the detected rotation of the charged particle beam barrel.

According to a second aspect of the invention, there is provided a method of making an exposure apparatus, comprising steps of: providing a substrate holder holding a substrate; and providing a charged particle beam barrel movable within a plane parallel to the surface of the substrate to expose the substrate by irradiating a charged particle beam onto the substrate. According to this method, it is possible to manufacture an exposure apparatus of the invention by mechanically, optically and electrically combining and adjusting the substrate holder, the charged particle beam and various other parts.

The making method of an exposure apparatus of the invention may further comprise a step of providing a vacuum chamber, which houses the substrate holder and the charged particle beam barrel. In this case, it is possible to make an exposure apparatus permitting efficient irradiation of a charged particle beam onto a target irradiation point on the substrate by a simple method.

The making method may further comprise a step of providing a pedestal on which the charged particle beam barrel is arranged, and a vibration attenuator arranged between the pedestal and the supporting member of the substrate holder. In this case, the risk of the irradiation point on the substrate of the charged particle beam from the charged particle beam barrel to deviate under the effect of vibration of the substrate holder is eliminated, and it is possible to make an exposure apparatus which can accurately irradiate the charged particle beam to a desired position on the substrate.

According to a third aspect of the invention, there is provided a method of exposing a substrate by the use of a charged particle beam, comprising a step of exposing a two-dimensional region on the substrate by the use of the charged particle beam, without moving the substrate two-dimensionally. According to this method, the two-dimensional region on the substrate is irradiated by the use of the charged particle beam without moving the substrate two-dimensionally. It is therefore possible to reduce the footprint to about a fourth compared with the conventional exposure method and expose a substrate, for example, when the charged particle beam barrel moves two-dimensionally while keeping the substrate in a fixed state. Also, when moving the substrate in a one-dimensional direction while moving the charged particle beam barrel in a direction perpendicular to the substrate moving direction, it is possible to expose the substrate with a footprint about a half the size compared with the conventional exposure method. Therefore, the footprint of the exposure apparatus can be largely reduced, compared with the case in which the charged particle beam barrel is fixed and the substrate (substrate holder) moves two-dimensionally.

It is possible to form a predetermined pattern on the substrate by exposing the substrate with a charged particle beam by the use of the exposure apparatus of the invention in a lithographic process, i.e., to manufacture a device having a very fine by using the exposure method of the invention. According to a still another aspect of the invention therefore, t here is provided a device manufactured by the use of the exposure method of the invention. This is a manufacturing method of a device, in a lithographic process, using the exposure apparatus of the invention, comprising the step of forming a predetermined pattern on a substrate by exposing the substrate by means of a charged particle beam. Use of the exposure method of the invention makes it possible to manufacture a device having an extrafine pattern. From a different point of view, this aspect of the invention relates to a manufacturing method of a device, in a lithographic process, of exposing the substrate with the charged particle beam and transferring a predetermined pattern onto the substrate.

DESCRIPTION OF THE PREFERRED EMBODIMENTS

<First Embodiment>

A first embodiment of the present invention will now be described with reference to FIGS. 1 to 3.

Figure 1:
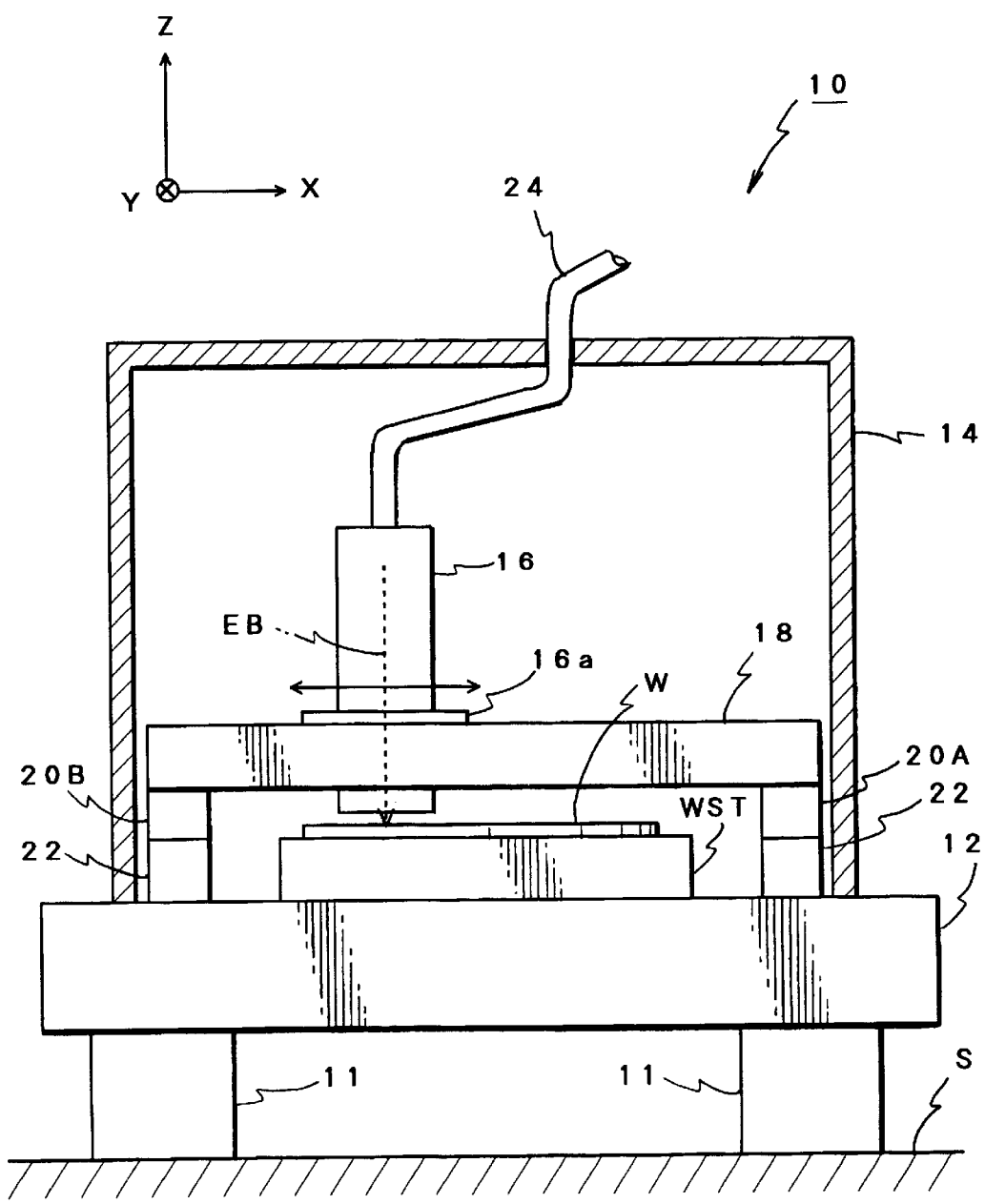
FIG. 1 illustrates a schematic configuration of the exposure apparatus of a first embodiment of the present invention.
Figure 2:
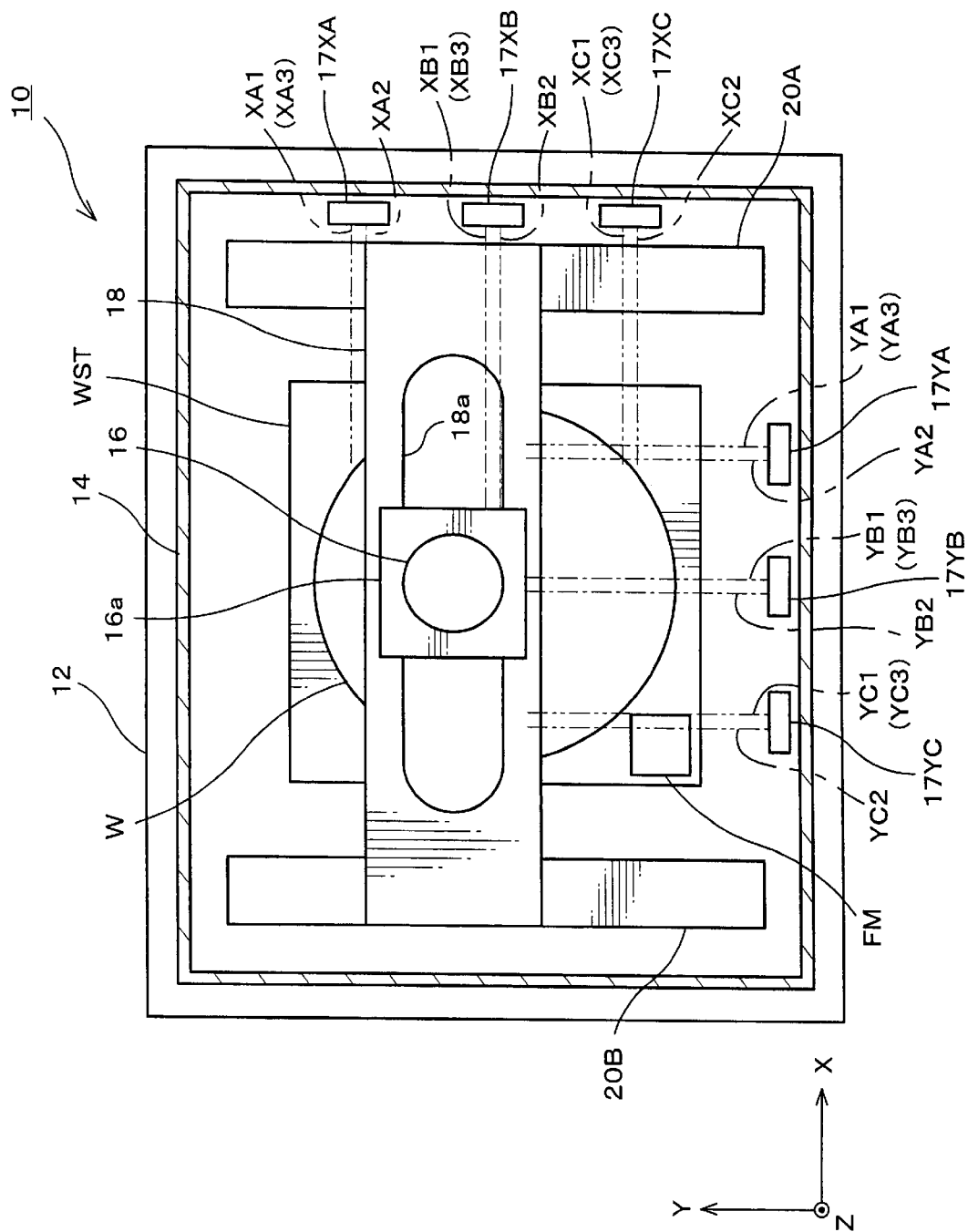
FIG. 2 is a plan view of a state in which an upper wall of the vacuum chamber is removed in the exposure apparatus shown in FIG. 1.

FIGS. 1 and 2 illustrate schematic configurations of the exposure apparatus 10 of the first embodiment. FIG. 1 is a plan view of the state in which a wall on this side of the drawing of a vacuum chamber composing the exposure apparatus 10 is removed; and FIG. 2 is a plan view of the state in which an upper wall of the vacuum chamber is removed.

This exposure apparatus 10 is an electron beam exposure apparatus provided with an electron beam barrel 16 serving as a charged particle beam barrel. This exposure apparatus 10 comprises a surface plate 12 serving as a stage supporting member held horizontal above the floor surface S by a plurality (four in this embodiment) of vibration isolators 11; a vacuum chamber 14 installed on this surface plate 12; a wafer stage WST serving as a substrate holder holding a wafer W serving as a substrate; and an electron beam barrel 16 moving two-dimensionally along a horizontal plane (XY plane) above the wafer W.

A so-called active vibration isolator is used as the vibration isolator 11. It is needless to mention that, as a vibration isolator, an air dumper which has a centering function (height adjusting function) to some extent, and capable of isolating vibration from the floor surface S on a micro-G level is well applicable.

The interior of the vacuum chamber 14 is evacuated by a vacuum pump (not shown in Figs.) to maintain a high degree of vacuum. Evacuation by the vacuum pump produces vibration in the vacuum chamber 14 and may cause the surface plate 12 to vibrate. In this embodiment, however, as described above, the surface plate 12 is supported by the active vibration isolator 11 which immediately attenuates the vibration and keeps the wafer stage WST free from the influence of the vibration.

A wafer holder (not shown in Figs.) provided with an electrostatic chuck (not shown in Figs.) is provided on the upper surface of the wafer stage WST, and the wafer W is fixed on this wafer holder. The wafer stage WST is finely drivable by a driving system (not shown in Figs.) in the Xaxis direction (the right-left direction in FIG. 1), the Yaxis direction perpendicular thereto (direction perpendicular to the paper surface in FIG. 1), and the θ direction (rotating direction around the Z axis perpendicular to the XY plane). The wafer holder is finely drivable in the Z direction and an inclined direction to the XY plane by a driving mechanism (not shown in Figs.). More particularly, the wafer W is adjustable for θ rotation (yawing) and inclination(rotation around the X axis and rotation around the Y axis known as pitching and rolling), and can make a movement in the XY direction by an amount corresponding to about one semiconductor chip, and a movement in the Z direction by about 100 μm.

The above-mentioned driving mechanism supports the wafer holder (or a table on which it is arranged) at three points arranged at equal angular intervals, and can perform focus and leveling control by independently adjusting the amount of driving of the three points in the Z axis direction. The stroke in the X direction or Y direction should be the same level or smaller than the moving stroke of the electron beam barrel described later. In other words, it may be determined within a range of not increasing the footprint, which depends on the moving mechanism of the electron beam barrel.

Therefore, fine adjustment of the relative position of the wafer stage WST to the electron beam barrel 16 upon positioning is easy, and correction of the software-like positioning program can be accomplished in a simplified manner. The position of the wafer stage W is measured by a position measuring instrument (not shown in Figs.) such as a laser interferometer with a predetermined resolution (for example, a resolution of about 0.5 to 1 nm). In addition, the wafer stage WST can be completely fixed. In this case, a θ rotation mechanism may be added to the driving mechanism of the wafer holder to drive the wafer holder in four degrees of freedom (x axis, Y axis, rotating direction around the Z axis and the Z direction).

Furthermore, a reference mark plate FM is secured, as shown in FIG. 2, near the wafer W on the upper surface of the wafer stage WST. The surface of this reference mark plate FM is set flush with the surface of the wafer W and various reference marks, including the reference mark for alignment, are formed on the surface.

Referring again to FIG. 1, the electron beam barrel 16 performs exposure of the resist on the wafer W by the usage of an electron beam EB, which is a charged particle beam, on the basis of prepared control data. The electron beam barrel 16 may be an electron optical system of a type which has a built-in electron gun, which emits the electron beam and converges it to a spot beam to perform a luster-scan or a vector-scan. It may also be a type which the beam emitted by the electron gun is shaped freely by a combination of apertures (slits of stencil masks), and the beam is irradiated to preferable areas for exposure by the usage of deflectors or the like.

Figure 3:
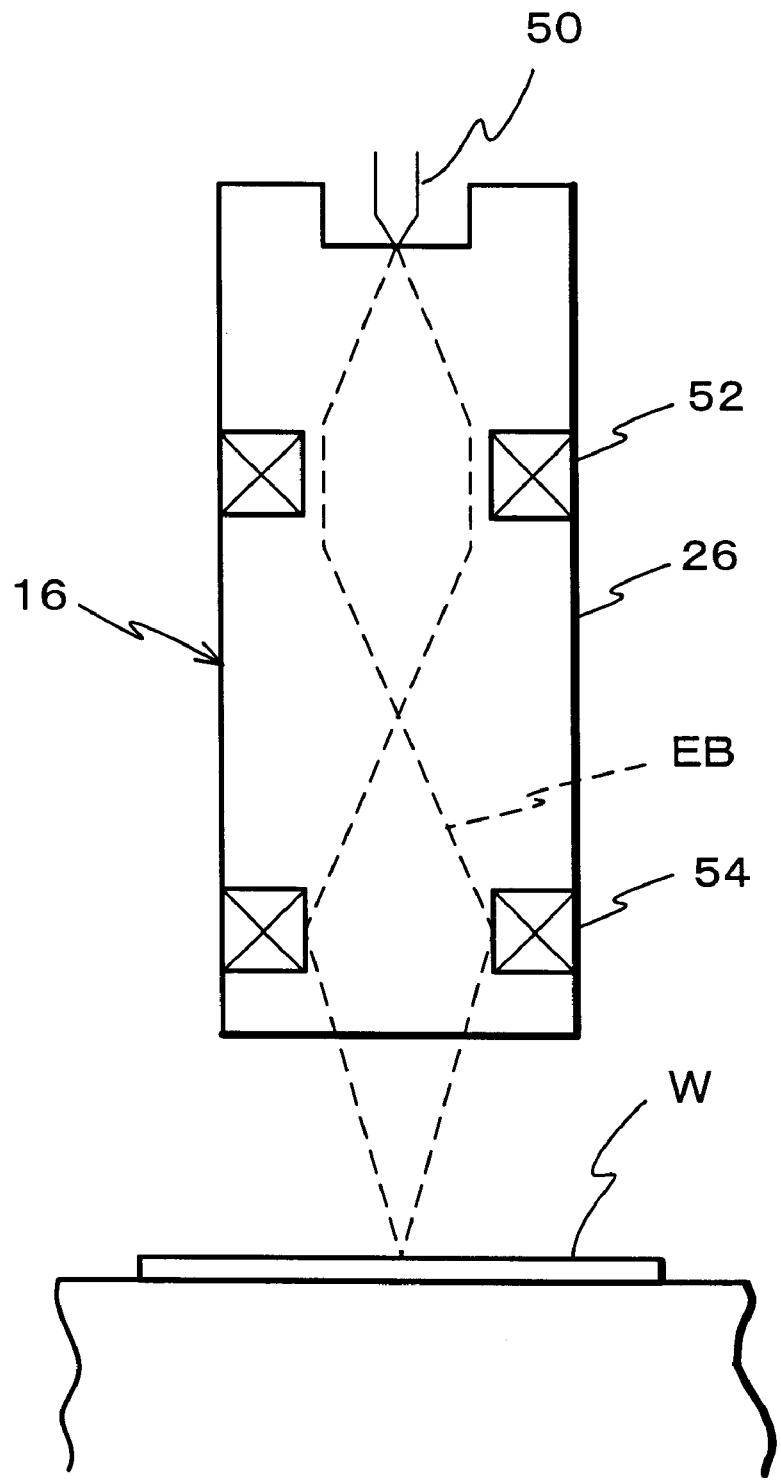
FIG. 3 illustrates a concrete example of internal configuration of the electron beam barrel shown in FIG. 1.

FIG. 3 illustrates an example of a detailed internal configuration of the electron beam barrel 16. The electron beam barrel 16 shown in FIG. 3 is a Gaussian type (including the pencil beam type) electron optical system having an electron gun 50, a first electromagnetic lens 52 and a second electromagnetic lens 54. In the electron beam barrel 16 shown in FIG. 3, the electron beam EB emitted from the electron gun 50 is accelerated and converged through an electromagnetic lens system comprising a first electromagnetic lens 52 and a second electromagnetic lens 54. These lenses are respectively impressed with a predetermined voltage, so as to form an electron beam on a spot, and the resist on the wafer W is exposed with this spot beam. As the electron beam barrel 16, the low-acceleration type accelerating electron beam with an acceleration voltage of 500 V to 30 kV is employed in this embodiment. Considering the current level of the thinning technique of a resist film, and the reduction of the effect of backscattering electron beams, it is practical to set the acceleration voltage within the range of 5 kV to 20 kV. Since the acceleration voltage is lower than the conventional level, the electron beam barrel 16 can be configured in a very small size compared with the conventional case shown in FIG. 9, more particularly, with a height within a range of 30 to 60 cm. While FIG. 3 illustrates the internal configuration of the electron beam barrel 16 in a simplified form, there are actually provided an objective aperture, a deflection electrode, a reflected electron detecting element and an astigmatizer correction coil.

Other possible configurations of the electron beam barrel 16 are described below: (1) cell projection type electron optical system which projects simple patterns such as squares of about 5 μm×5 μm and parallelograms previously formed on a mask (aperture); (2) an electron optical system which forms variable shapes of beams, an electron optical system which irradiates a beam of a certain size (square of 5 μm×5 μm) to a mask (aperture) on which patterns slightly more complicated than the cell projection type are previously formed, and projects a pattern corresponding to the shape of the electron beam via the mask; (3) EBDW (EB direct drawing) including the blanking aperture array type in which the mask has a plurality of shutters (usually, electrodes are formed as shutters by matrix arrangement on a dielectric mask, and the electrodes function as a kind of capacitors by applying or not applying a certain voltage at positions of the individual electrodes) and (4) EBPS (EB projection system) which exposes an area of about 250 μm square at a time by the use of a mask (stencil mask) similar to an optical exposure apparatus. Furthermore, an electron beam barrel may be configured with an arbitrary combination of the Gaussian beam type and any of the above-mentioned types (1) to (4). What is essential, is to permit a sufficiently finer exposure than in an optical exposure. The above-mentioned EBPS include a type in which a mask is drivable as disclosed in U.S. patent application Ser. No. 08/768201 (application date: Dec. 17, 1996), which is fully incorporated by reference herein. In the case this type is employed, scanning exposure which synchronously moves the mask and substrate can be performed.

Referring back to FIG. 1, a flange 16a is provided at a position slightly lower than the height center of the electronic beam barrel 16. In the exposure apparatus 10 of this embodiment, the electron beam barrel 16 is drivable by a linear motor (not shown in Figs.) along an X guide running in the X direction. More specifically, a thin and long guide hole 18a is formed in the X direction at the center of the Y direction as shown in FIG. 2. The lower portion of the electron beam barrel 16 is inserted vertically through this guide hole 18a, and the bottom surface of the flange 16a is supported by levitation, spaced apart by several μm from the upper surface of the X guide. In this case, driving coils are built in the X guide 18 in the X direction. Permanent magnets are provided on the bottom surface of the flange 16a. The X linear motor that drives the electron beam barrel 16 along the X guide is structured of the driving coils and the permanent magnets.

The above-mentioned X guide 18 has both longitudinal ends supported by levitation, spaced apart by several μm from the upper surface of a pair of Y guides 20A and 20B extending in the Y direction. In this case, driving coils are built in the Y guides 20A and 20B in the Y direction, and the permanent magnets are provided on the bottom surfaces at the both longitudinal ends of the X guide 18, respectively. The above-mentioned driving coils and the permanent magnets form a pair of linear motors which drive the electron beam barrel 16 integrally with the X guide 18 along the Y guides 20A and 20B.

The flange 16a and X guide 18 may be supported by levitation above the X guide 18 and the Y guides 20A and 20B by magnetic force or electromagnetic force. The configuration is not however limited to this. At least one of the flange 16a and the X guide 18 may be supported by levitation above the supported object by a balance between the pressure of a compressed gas released onto the supported object (S guide 18, and the Y guides 20A and 20B) and the vacuum suction force. In this case, the compressed gas is released from a static pressure gas bearing.

To shield the magnetism generated by the X linear motor and the Y linear motor, magnetic shielding members (not shown in Figs.) are provided around the path of electron beam EB including the electron beam barrel 16.

The linear motor (Y guides 20A and 20B) may be arranged outside the chamber 14, together with an anti-vibration pad 22. The anti-vibration pad 22 may be arranged on the surface plate 12, or directly on the floor surface S (or on the base plate) on which the vibration isolator 11 is arranged.

In the exposure apparatus 10 of this embodiment, the electron beam barrel 16 is driven in the XY two-dimensional direction by the X linear motor and the Y linear motor. The moving stroke in the X and Y directions of the electron beam barrel is substantially the same as the diameter of the wafer W.

In this embodiment, the flange 16a of the electron beam barrel 16 is formed into a rectangular shape having the X direction and the Y direction as its two sides. The side surface on the "−" side in the Y direction (on the −Y side) and the side surface on the "+" side in the X direction (on the +X side) are mirror-processed into reflecting surfaces. Alternatively, a moving mirror comprising flat mirrors extending in the X axis direction and the Y axis direction may of course be arranged. In the following description, the above-mentioned reflecting surface on the "−" side in the Y direction is called the Y moving mirror, and the reflecting surface on the "+" side in the X direction is called the X moving mirror.

On the upper surface of the surface plate 12, X position detecting laser interferometers 17XA, 17XB and 17XC and Y position detecting laser interferometers 17YA, 17YB and 17YC corresponding to the X moving mirror and Y moving mirror are arranged. In this embodiment, a laser interferometer system for detecting X and Y positions, and positions of rotation around the Z axis (yawing), rotation around the X axis (pitching) and rotation around the Y axis (rolling) is structured by these six laser interferometers 17XA, 17XB, 17XC, 17YA, 17YB and 17YC.

The individual interferometers composing this laser interferometer system and their functions will now be described in detail.

The X position detecting laser interferometer 17XB is a tri-axial interferometer having three X direction length measuring axes XB1, XB2 and XB3. The length measuring axis XB1 and the length measuring axis XB2 are arranged at a predetermined interval in the Y axis direction on the same XY plane, and the length measuring axis XB1 and the length measuring axis XB3 are arranged at a predetermined interval in the Z direction on the same YZ plane. This laser interferometer 17XB irradiates length measuring beams of the three above-mentioned length measuring axes perpendicularly to the X moving mirror, and measures the X direction position of the X moving mirror at points irradiated by the length measuring beams on the basis of the respective reflected beams. In this case, the X position of the flange 16a, i.e., the electron beam barrel 16 is determined on the basis of the average value of the measured value of the length measuring axis XB1 and the measured value of the length measuring axis XB2, and the amount of rotation around the Z axis (amount of yawing) of the flange 16a, i.e., the electron beam barrel 16 is determined on the basis of the difference between these measured values and the interval between the length measuring axes. The amount of rotation around the Y axis (amount of rolling) of the flange 16a, i.e., the electron beam barrel 16 is determined on the basis of the difference between the measured value of the length measuring axis XB1 and the measured value of the length measuring axis XB3 and the interval between the length measuring axes.

The X position detecting laser interferometer 17XA, as in the above-mentioned laser interferometer 17XB, has three X direction length measuring axes XA1, XA2 and XA3. When the flange 16a is present at a position where length measuring beams of the three length measuring axes can be irradiated onto the X moving mirror, the X position of the flange 16a, i.e., the electron beam barrel 16 is determined on the basis of the average value of the measured value of the length measuring axis XA1 and the measured value of the length measuring axis XA2. The amount of rotation around the Z axis (amount of yawing) of the flange 16a, i.e., the electron beam barrel 16 is determined on the basis of the difference between the both measured values and the interval between the length measuring axis. The amount of rotation around the Y axis (amount of rolling) of the flange 16a, i.e., the electron beam barrel 16 is determined on the basis of the difference between the measured value of the length measuring axis AX1 and the measured value of the length measuring axis XA3 and the interval between the length measuring axes.

The remaining X position detecting laser interferometer 17XC has, similar to the above-mentioned laser interferometer 17XB, three X direction length measuring axes XC1, XC2 and XC3. When the flange 16a is present at a position where length measuring beams of the three length measuring axes can be irradiated onto the X moving mirror, the X position of the flange 16a, i.e., the electron beam barrel 16 is determined on the basis of the average value of the measured value of the length measuring axis XC1 and the measured value of the length measuring axis XC2. The amount of rotation around the Z axis (amount of yawing) of the flange 16a, i.e., the electron beam barrel 16 is determined on the basis of the difference between both measurements and the interval between the length measuring axes. The amount of rotation around the Y axis (amount of rolling) of the flange 16a, i.e., the electron beam barrel 16 is determined on the basis of the difference between the measured value of the length measuring axis XC1 and the measured value of the length measuring axis XC3 and the interval between the length measuring axes.

The laser interferometers 17XA, 17XB and 17XC are arranged so that length measuring beams emitted by at least one of the laser interferometers 17XA, 17XB and 17XC (length measuring beams along one, two, or three axes among the above-mentioned three length measuring axes; in the case of the laser interferometer 17XA for example, length measuring beams along the length measuring axis XA2, the length measuring axes XA1 and XA3, or all of the three length measuring axes) are irradiated over the entire area of the stroke range of the electron beam barrel 16 in the Y direction (in FIG. 2, the interferometer 17XB irradiates the X moving mirror). Furthermore, the laser interferometers 17XA, 17XB and 17XC are arranged in the Y direction so that, immediately before the length measuring beam of the laser interferometer (for example, the laser interferometer 17C) which irradiates the length measuring beam onto the X moving mirror by movement of the electron beam barrel 16 (for example, in the +Y direction) misses the X moving mirror, the length measuring beam of the laser interferometer (for example, the laser interferometer 17B) adjacent thereto in the moving direction is irradiated onto the X moving mirror. As a result, output of the laser interferometer (for example, the laser interferometer 17B) irradiating a new length measuring beam onto the X moving mirror is preset (that is, set to the same output value) so that it succeeds the detection results of the laser interferometer which had irradiated the laser beam onto the X moving mirror. In this case, the electron beam barrel 16 may be rotating around the Z axis, therefore, it is recommendable to add an offset to the preset value. This can correct the rotation error in respect to the status of rotation from the initial condition (or at the time of the preceding measurement of yawing). Consequently, the X position, rotation around the Z axis, and rotation around the Y axis of the electron beam barrel 16 are continuously detected over the entire range of Y direction stroke of the electron beam barrel 16.

The Y position detecting laser interferometer 17YB is a tri-axial interferometer having three Y direction length measuring axes YB1, YB2 and YB3. The length measuring axis YB1 and the length measuring axis YB2 are arranged on the same XY plane at a predetermined interval in the X axis direction, and the length measuring axis YB1 and the length measuring axis YB3 are arranged on the same XZ plane at a predetermined interval in the Z direction. The laser interferometer 17YB irradiates the length measuring beams of the above-mentioned length measuring axes perpendicular to the X moving mirror and measures Y direction position of the Y moving mirror of the irradiation point of the length measuring beam on the basis of the respective reflected beams. In this case, the Y direction of the flange 16a, i.e., the electron beam barrel 16 is determined on the basis of the average value of the measured value of the length measuring axis YB1 and the measured value of the length measuring axis YB2, and the amount of rotation (amount of yawing) around the Z axis of the flange 16a, i.e., the electron beam barrel 16 is determined on the basis of the difference between the two measurements and the interval between the length measuring axes. The amount of rotation (amount of pitching) around the X axis of the flange 16a, i.e., the electron beam barrel 16 is determined on the basis of the difference between the measured value of the length measuring axis YB1 and the measured value of the length measuring axis YB3 and the interval between the length measuring axes.

The Y position detecting laser interferometer 17YA has, like the laser interferometer 17YB, three length measuring axes YA1, YA2 and YA3 in the Y direction. When the flange 16a is present at a position where length measuring beams of the three length measuring axes can be irradiated onto the Y moving mirror, the Y position of the flange 16a, i.e., the electron beam barrel 16 is determined on the basis of the average value of the measured value of the length measuring axis YA1 and the measured value of the length measuring axis YA2, and the amount of rotation (amount of yawing) around the Z axis of the flange 16a, i.e., the electron beam barrel 16 is determined on the basis of the difference between the two measurements and the interval between the length measuring axes. The amount of rotation (amount of pitching) around the X axis of the flange 16a, i.e., the electron beam barrel 16 is determined on the basis of the difference between the measured value of the length measuring axis YA1 and the measured value of the length measuring axis YA3 and the interval between the length measuring axes.

The remaining Y position detecting interferometer 17YC has, like the laser interferometer 17B, three length measuring axes YC1, YC2 and YC3 in the Y direction. When the flange 16a is present at a position where the length measuring beams of the three length measuring axes can be irradiated onto the Y moving mirror, the Y position of the flange 16a, i.e., the electron beam barrel 16 is determined on the basis of the average value of the measured value of the length measuring axis YC1 and the measured value of the length measuring axis YC2, and the amount of rotation (amount of yawing) around the Z axis of the flange 16a, i.e., the electron beam barrel 16 is determined on the basis of the difference between the two measurements and the interval between the length measuring axes. The amount of rotation (amount of pitching) around the X axis of the flange 16a, i.e., the electron beam barrel 16 is determined on the basis of the difference between the measured value of the length measuring axis YC1 and the measured value of the length measuring axis YC3 and the interval between the length measuring axes.

The laser interferometers 17YA, 17YB and 17YC are all arranged in the X direction in the same manner as the arrangement relationship of the laser interferometers 17XA, 17XB and 17XC in the Y direction. They continuously detect the Y position, rotation around the Z axis and rotation around the X axis of the electron beam barrel 16 over the entire X direction stroke range of the electron beam barrel 16 by performing identical presetting as in the case of the laser interferometers 17XA, 17XB and 17XC.

Either one, or the average value of both the rotation around the Z axis is detected on the basis of the length measuring result by the X position detecting laser interferometers 17XA, 17XB and 17XC, and the rotation around the Z axis detected on the basis of the length measuring result by the Y position detecting laser interferometers 17YA, 17YB and 17YC can be detected as the rotation around the Z axis.

Calibration of the position detecting laser interferometer system of the electron beam barrel 16 is conducted as follows as required.

In a state in which length measuring beam emitted from at least a laser interferometer from among the laser interferometers 17XA to 17XC is irradiated onto the X moving mirror, and the length measuring beam emitted by at least a laser interferometer from among the laser interferometers 17YA to 17YC is irradiated onto the Y moving mirror, the surface mark arrange on the reference mark plate FM on the wafer stage is detected by electron beam irradiated from the electron beam barrel 16. The reference mark is detected in the same manner as in detection of the wafer mark by a reflected electron detecting element (not shown in Figs.) used for detecting the wafer mark described later.

Using the positional information obtained from the laser interferometer for detecting the position of the wafer stage WST upon detecting the reference mark, and detection result of the mark (as required, the amount of deflection of electron beam), the electron beam, i.e., the electron beam barrel 16 is positioned relative to the reference mark on the wafer stage WST positioned, for example, at a predetermined calibration position, and in this state, the positional information obtained from the individual length measuring axes of the interferometer system for the electron beam barrel 16 is correlated with the position of the electron beam barrel 16, that is, presetting is performed.

When fixing the wafer stage WST, the interferometer system for the wafer stage WST is unnecessary: upon presetting, it suffices to position the electron beam barrel 16 so that the reference mark is detected by the electron beam EB, and in this state (including the state in which the amount of positional shift between the electron beam and the reference mark), to correlate positional information obtained from the individual length measuring axes of the interferometer system for the electron beam barrel 16 with the position of the electron beam barrel 16. When the wafer stage WST is fixed, it is necessary to provide a plurality of reference mark plates in response to the arrangement of the individual interferometers of the interferometer system for the electron beam barrel 16. More specifically, it is necessary to provide reference mark plates at positions where the reference mark can be detected by the electron beam EB in a state in which length measuring beams from two interferometers from among the X position detecting interferometers 17XA, 17XB and 17XC are irradiated onto the X moving mirror, and positions where the reference marks can be detected by the electron beam EB in a state in which length measuring beams from one of the above two interferometers and remaining X interferometer are irradiated onto the X moving mirror. This is also the case with the Y direction. Therefore, for example, in the case of the wafer stage WST shown in FIG. 2, it suffices to provide other reference mark plate at positions of the +X direction end and +Y direction end of the wafer stage WST, in addition to the reference mark plate FM. Even when the wafer stage is movable, it may similarly be necessary to provide a plurality of reference mark plates, depending on the stroke.

The X moving mirror and the Y moving mirror may be formed by mirror-processing a side surface of the flange 16a, or they may be provided in the electron beam barrel 16. The arranged number and the arrangement interval of the X position detecting laser interferometer and Y position detecting laser interferometer are determined in accordance with the relationship between the moving stroke in the X direction and the Y direction of the electron beam barrel 16, the Y direction length of the X moving mirror and the X direction length of the Y moving mirror. For example, when the Y direction length of the X moving mirror and the X direction length of the Y moving mirror are set so as to cover substantially the entire range of the moving stroke of the electron beam barrel in the X and Y directions, it suffices to provide one X position detecting laser interferometer and one Y direction detecting laser interferometer.

In order to fully fix the wafer stage WST, a fixed mirror in the position detecting laser interferometer system of the electron beam barrel 16 may be provided on the wafer stage WST, or, a side surface of the wafer stage WST may be mirror-processed to use as a fixed mirror in the position detecting laser interferometer system for the electron beam barrel 16.

A gap sensor (not shown in Figs.) for detecting the interval between the electron beam barrel 16 and the wafer W is provided on the electron beam barrel 16. The interval between the electron beam barrel 16 and the wafer W can be detected by employing a focus sensor of the inclined incidence type arranged on the electron beam barrel 16, to monitor the interval between the electron beam barrel 16 and the wafer.

In the exposure apparatus 10 of this embodiment, a control unit (not shown in Figs.) controls the position of the electron beam barrel 16 and the amount of deflection of the electron beam EB while monitoring measured values obtained by the position detecting laser interferometer system and the gap sensor of the electron beam barrel 16. That is, the position of the electron beam barrel 16 is controlled by an X linear motor and a Y linear motor, on the basis of the detection results of the X position and the Y position of the electron beam barrel 16. The amount of deflection of the electron beam EB is controlled for the purpose of correcting the irradiation point of the electron beam EB on the basis of the detection result of rotation of the electron beam barrel 16 around the X axis and around the Y axis, i.e., the detection result of the incline of the electron beam barrel 16. In order to correct the irradiation point of the electron beam EB, the position of the electron beam barrel 16 may be controlled by an X linear motor and a Y linear motor, or movement of the wafer W may be controlled. The correction may also be carried out by combining these with the amount of deflection of the electron beam EB being controlled.

In general, rotation of the wafer W around the Z axis is controlled on the basis of the detection result of rotation of the electron beam barrel 16 around the Z axis. Rotational control of the wafer W around the Z axis is not necessary for the Gaussian beam type as in this embodiment. In this embodiment, the amount of deflection of the electron beam EB is controlled on the basis of the detection result of rotation of the electron beam barrel 16 around the Z axis.

By the control unit, a control signal corresponding to the information about the pattern to be drawn is sent to the electron beam barrel 16 via a signal line 24 (see FIG. 1). As a result, the electron beam EB from the electron beam barrel 16 is irradiated onto a desired irradiation point of the resist on the wafer W, thus exposing the irradiation point on the resist. It is possible to draw a desired pattern by irradiating the electron beam EB onto almost the entire surface of the wafer W by carrying out this exposure while moving the electron beam barrel 16 in the XY two-dimensional directions.

When both the electron beam barrel 16 and the wafer stage WST are moved to expose the resist with the electron beam, it is recommendable to previously correlate (preset) measured values of the interferometer system for the electron beam barrel 16 and the interferometer system for the wafer stage WST prior to exposure. A typical process comprises the steps of positioning the wafer stage WST at the calibration position (origin point of an orthogonal coordinate system defined by the position detecting interferometer system), the electron beam detecting the reference mark arranged on the reference mark plate FM, and in this state, storing the positional information obtained from the interferometer for the electron beam barrel 16, or presetting the interferometer to a predetermined value (including zero-presetting).

The Y guides 20A and 20B are supported in parallel with the surface plate 12 via anti-vibration pads serving as a plurality of vibration attenuators fixed to the upper surface of the surface plate 12. That is, in this embodiment, a pedestal on which the electron barrel 16 serving as a charged particle beam barrel 16 is constructed by the X guide 18 and the Y guides 20A and 20B. The anti-vibration pads 22 are arranged between the pedestal and the surface plate 12 serving as a supporting member of the wafer stage WST. As a result, vibration on the side of pedestals (18, 20A and 20B) produced with reaction force of thrust of the X linear motor and Y linear motor upon movement of the electron beam barrel 16 is attenuated by the anti-vibration pads 22 during transfer to the surface plate 12. Vibration of the pedestals (18, 20A and 20B) caused by the movement of the electron beam barrel 16 exerts almost no effect on the wafer stage WST. The irradiation point on the wafer W of electron beam EB from the electron beam barrel 16 does not shift, and it is possible to accurately irradiate electron beam EB onto a desired area on the wafer W.

With a view to cancelling the reaction force produced with movement of the electron beam barrel 16, a movable member may be provided between the pedestals (18, 20A and 20B) and the anti-vibration pads 22. In this configuration, the anti-vibration pads 22 and the movable member, and the movable member and the pedestals (18, 20A and 20B) are kept in a non-contact state through magnetic levitation or the like, and the movable member is freely movable in response to the reaction force (configuration having a counter weight). In addition to the above, techniques for releasing the reaction force by the use of a movable member freely movable in response to the reaction force are disclosed, for example, in U.S. Pat. No. 5,528,118, U.S. patent application Ser. No. 08/266999 (application date: Jun. 27, 1994), and U.S. patent application Ser. No. 08/416558 (application data: Apr. 4, 1995), which are fully incorporated by reference herein. When using any of the techniques disclosed by these publications and the like, it suffices to adopt a configuration releasing the reaction force of an electron beam barrel or a holding member holding the same in place of a reticle stage or a wafer stage disclosed in these publications and the like.

It is also possible to use a configuration in which at least three actuators (at least two actuators for any one of the X direction and the Y direction and at least one actuator for other direction) and a force of cancelling the reaction force (a force of cancelling reaction force for three degrees of freedom including X direction, Y direction and rotating direction around the Z axis) is imparted to the pedestal or the base by means of these actuators. In this case, acceleration sensors are attached to at least three points of the pedestals (18, 20A and 20B), and the force imparted to the pedestals (18, 20A and 20B) is controlled on the basis of the detection result of acceleration at the individual positions by these acceleration sensors. The technique of cancelling the reaction force by imparting a force of cancelling the reaction force in response to the extent of the reaction force is disclosed, for example, in U.S. patent application Ser. No. 08/624358 (application date: Apr. 11, 1994), which is fully incorporated by reference herein.

Furthermore, in the exposure apparatus of this embodiment, the position of the alignment mark formed on the wafer W is detected by irradiating electron beam from the electron beam barrel 16 onto the wafer W, and detecting secondary electron (reflected electron) from the wafer W surface by means of a reflected electron detecting element (not shown in Figs.). By the side of the electron beam barrel 16, a proximity microscope such as an optical microscope or an interatomic microscope may be provided as an off-axis alignment microscope, and measurement of the wafer position, or positional detection of the alignment mark may be performed by moving the microscope integrally with the electron beam barrel 16. In any case, for example, when sequentially exposing a plurality of divided areas (chip areas) on the wafer, the enhanced global alignment (EGA) method of determining the arrangement coordinates of each of the shot areas on the wafer W through predetermined statistical calculations as disclosed in U.S. Pat. No. 4,780,617 may be adopted. The disclosure of the U.S. Pat. No. 4,780,617 is fully incorporated by reference herein.

The optical microscope, i.e., the alignment system provided separately from the electron beam barrel 16 is disclosed, for example, in U.S. Pat. No. 5,493,403, which is fully incorporated by reference herein.

When providing an alignment system (including an optical microscope) integrally with the electron beam barrel 16, it is desirable to previously measure the positional relationship between the irradiation position of electron beam and the detection center of the alignment system, i.e., the amount of base line of the alignment system. Therefore, a first reference mark detected by electron beam and a second reference mark detected by the alignment system are arranged on the wafer stage at an interval corresponding to the amount of base line, and the amount of base line is determined on the basis of the result of detection of the first and second reference marks by electron beam EB and the alignment system and the interval between the first and second reference marks. Although there is a difference of an electron beam barrel and an optical barrel, measurement of base line by an off-axis alignment sensor in an optical exposure apparatus is disclosed, for example, in U.S. Pat. No. 5,243,195, which is fully incorporated by reference herein.

Figure 9:
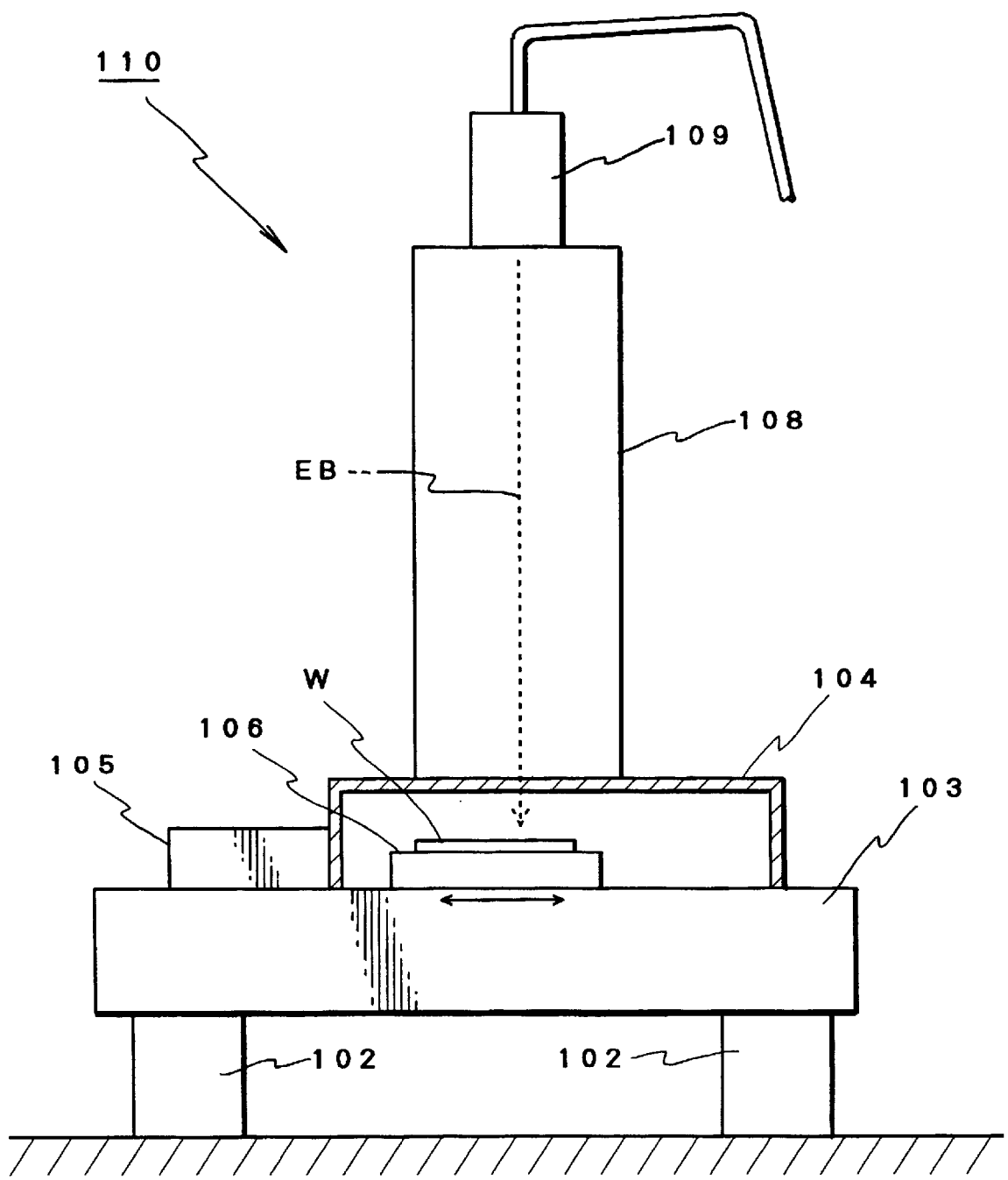
FIG. 9 illustrates a conventional exposure apparatus.

Although not shown in FIG. 1, a pre-chamber of a slightly lower degree of vacuum than in the vacuum chamber 14 is provided adjacent to the vacuum chamber 14 (for example, one corresponding to the pre-stage chamber 105 in FIG. 9), so that the wafer W is introduced and removed into and from the vacuum chamber 14 by opening the door to the vacuum chamber 14 in a closed state of the pre-chamber. This is for preventing sudden decrease in the degree of vacuum in the vacuum chamber 14 upon charging or removing the wafer W.

A device producing method using the above exposure apparatus and method in a lithographic process will be described in detail next.

Figure 4:
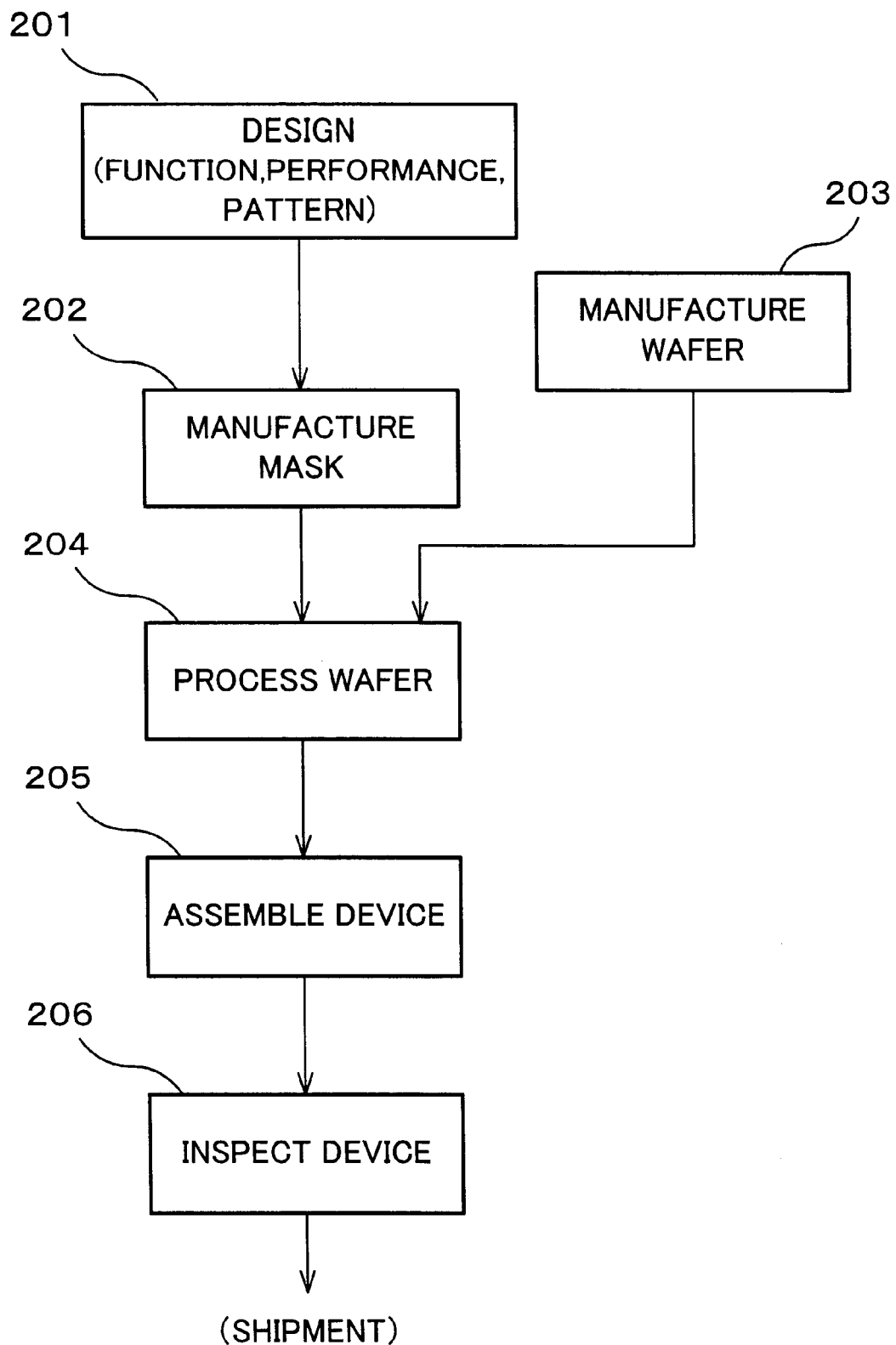
FIG. 4 is a flowchart for explaining the device manufacturing method of a first embodiment of the invention.

FIG. 4 is a flow chart showing an example of producing a device (a semiconductor chip such as an IC or LSI, a liquid crystal panel, a CCD, a thin magnetic head, a micromachine, or the like). As shown in FIG. 4, in step 201 (design step), function/performance is designed for a device (e.g., circuit design for a semiconductor device) and a pattern to implement the function is designed. In step 202 (mask producing step), a mask on which the designed circuit pattern is formed is manufactured. In step 203 (wafer producing step), a wafer is producing by using a silicon material or the like.

In step 204 (wafer processing step), an actual circuit and the like are formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 5:
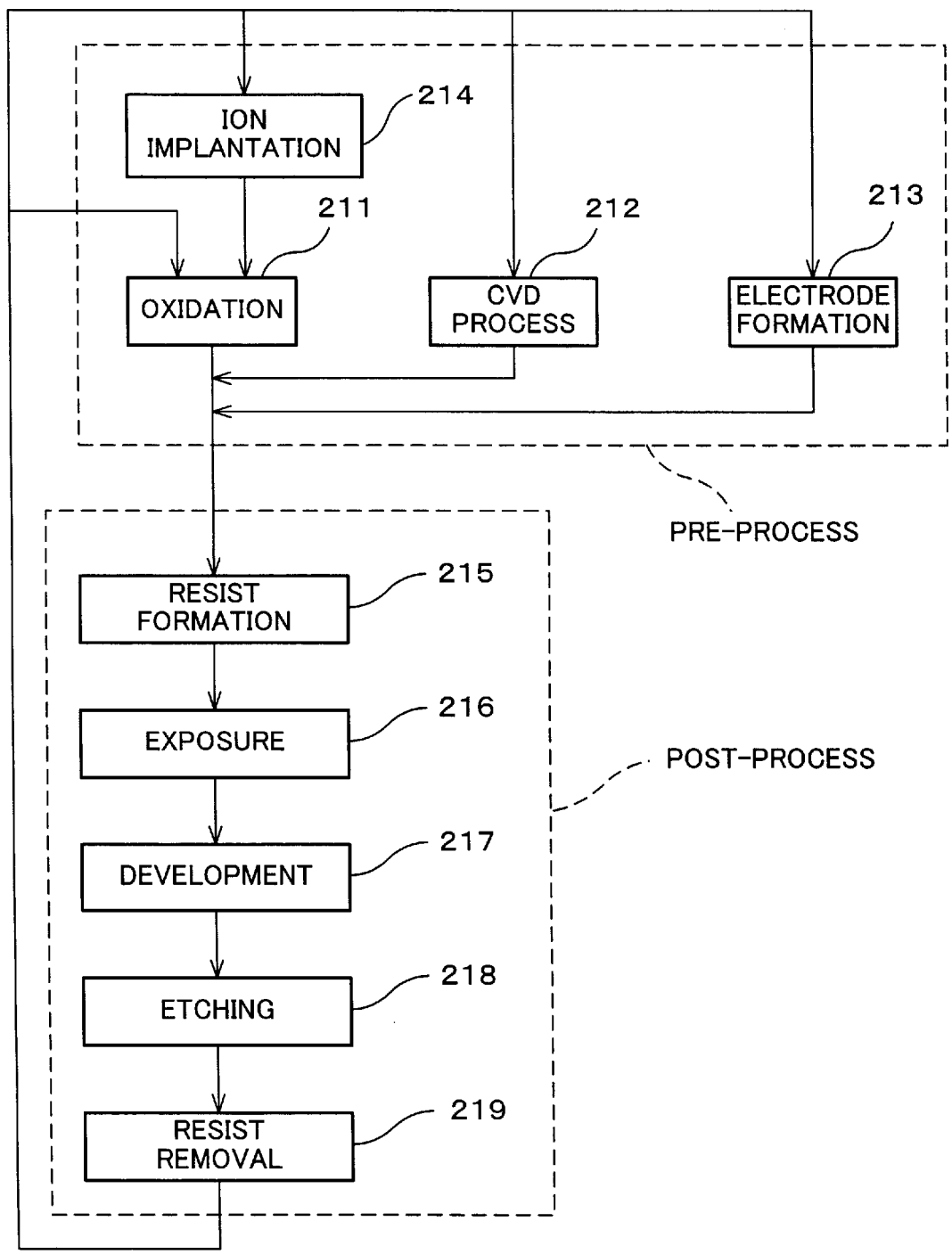
FIG. 5 is a flowchart of processing in a wafer process step (step 204) shown in FIG. 4.

FIG. 5 is a flow chart showing a detailed example of step 204 described above in producing the semiconductor device. Referring to FIG. 5, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process, multiple circuit patterns are formed on the wafer.

According to the exposure apparatus 10 of this embodiment, as described above, the entire surface of the wafer W can be exposed by the XY two-dimensional movement of the electron beam barrel 16, and this permits reduction of footprint of the apparatus. More specifically, when the wafer stage WST side makes a two-dimensional movement, and a 12-inch wafer (wafer having a diameter of 300 mm) is to be exposed, it is necessary to provide an area of 600 mm square for movement of the wafer stage. When the electron beam barrel 16 moves as in this embodiment, in contrast, a moving stroke of 300 mm, of the same order as the wafer diameter, suffices. This is about a fourth that is required in the case of the wafer state side moving.

Therefore, even when conducting mix-and-match with the optical exposure apparatus described previously by the use of a plurality of the exposure apparatus 10 of this embodiment, the increment of the footprint, i.e., the increment of the clean room area can be reduced to about a fourth as compared with the conventional case, thus making it easier to introduce mix-and-match. In a mix-and-match with an optical exposure apparatus, it is possible to perform correcting exposure of four corners of a rectangular pattern or a corner portion of an L-shaped pattern transferred with an optical exposure apparatus, and transfers only a fine pattern exceeding the resolution limit of the optical exposure apparatus such as transfer of a very fine line pattern connected to a large-area pattern transferred with the use of the optical exposure apparatus by the use of the exposure apparatus 10 of this embodiment. It is of course possible to use a configuration in which the layer exposed by the optical exposure apparatus is different from the layer exposed by the exposure apparatus of this embodiment.

Since a low-acceleration type electron beam barrel 16 is adopted in this embodiment, it is possible to achieve a very small size of the barrel 16, and hence to downsize the driving system driving the barrel 16. In a low-acceleration electron beam exposure as in this embodiment, the resist sensitivity becomes higher than that in a medium or high-acceleration electron beam exposure even with the same resist. Furthermore, in a low-acceleration electron beam exposure as in this embodiment, a proximity effect caused by back-scattering does not occur, thus eliminating the necessity of a high-level correction such as correction of the amount of current or correction of the master pattern. The burden of generating control data for controlling electron beam is therefore alleviated to a large extent.

The acceleration voltage of electron beam irradiated onto the wafer W depends upon the kind of resist material used and the thickness of the resist film. A lower acceleration voltage requires a thinner film thickness. According as the acceleration voltage is lower, the thickness of the resist film capable of being exposed becomes thinner. A resist material having a satisfactory sensitivity such as a chemical amplifying type one should be used with a thickness of up to 0.2 $\mu$m. When using a multi-layer resist, the film thickness can be about 10 nm.

The exposure apparatus 10 of the invention can be made by horizontally arranging the surface plate 12 above the vibration isolator 11, placing the wafer stage WST on the surface plate 12, providing the electron beam barrel 16 making a two-dimensional movement along a horizontal plane (XY plane) above the wafer stage WST, and providing the vacuum chamber 14, thereby performing comprehensive adjustment (electrical adjustment, operational confirmation)

In this embodiment, the exposed area on the substrate W is changed by the movement of the electron beam barrel 16. It is of course possible to change the exposed area on the substrate W by the simultaneous use of the movement of the electron beam barrel 16 and the deflection of the electron beam EB.

In this embodiment, the moving stroke of the electron beam barrel 16 is of the order of the diameter of the substrate W. It is needless to mention that the moving stroke of the electron beam barrel 16 may be longer than the substrate W diameter. For a particular arrangement of the reference mark plate FM provided on the wafer stage WST, the moving stroke of the electron beam barrel 16 should preferably be longer in respect to the position of arrangement thereof.

It is possible to use a moving stroke of the electron beam barrel 16 shorter than the diameter of the substrate W. In this case, the wafer stage WST may be made movable by a distance corresponding to this difference. Even in such a case, the footprint is smaller than the conventional one.

In this embodiment, four vibration isolators 11 are arranged to support the surface plate 12. The number of arranged surface tables 12 is not particularly limited, as long as it is three or more.

Upon positioning (alignment) of electron beam EB relative to the substrate W, a relatively rough positioning is used for movement of the electron beam barrel 16: for example, it is used for movement between shots or between chips, and depending upon the deflectable amount of electron beam, the final positioning of electron beam relative to the wafer W (fine alignment) may be made in response to the deflection of electron beam.

<Second Embodiment>

A second embodiment of the invention will now be described with reference to FIGS. 6 and 7. For the same or equivalent component parts as those in the first embodiment described above, the same reference numerals are used and the description is omitted.

Figure 6:
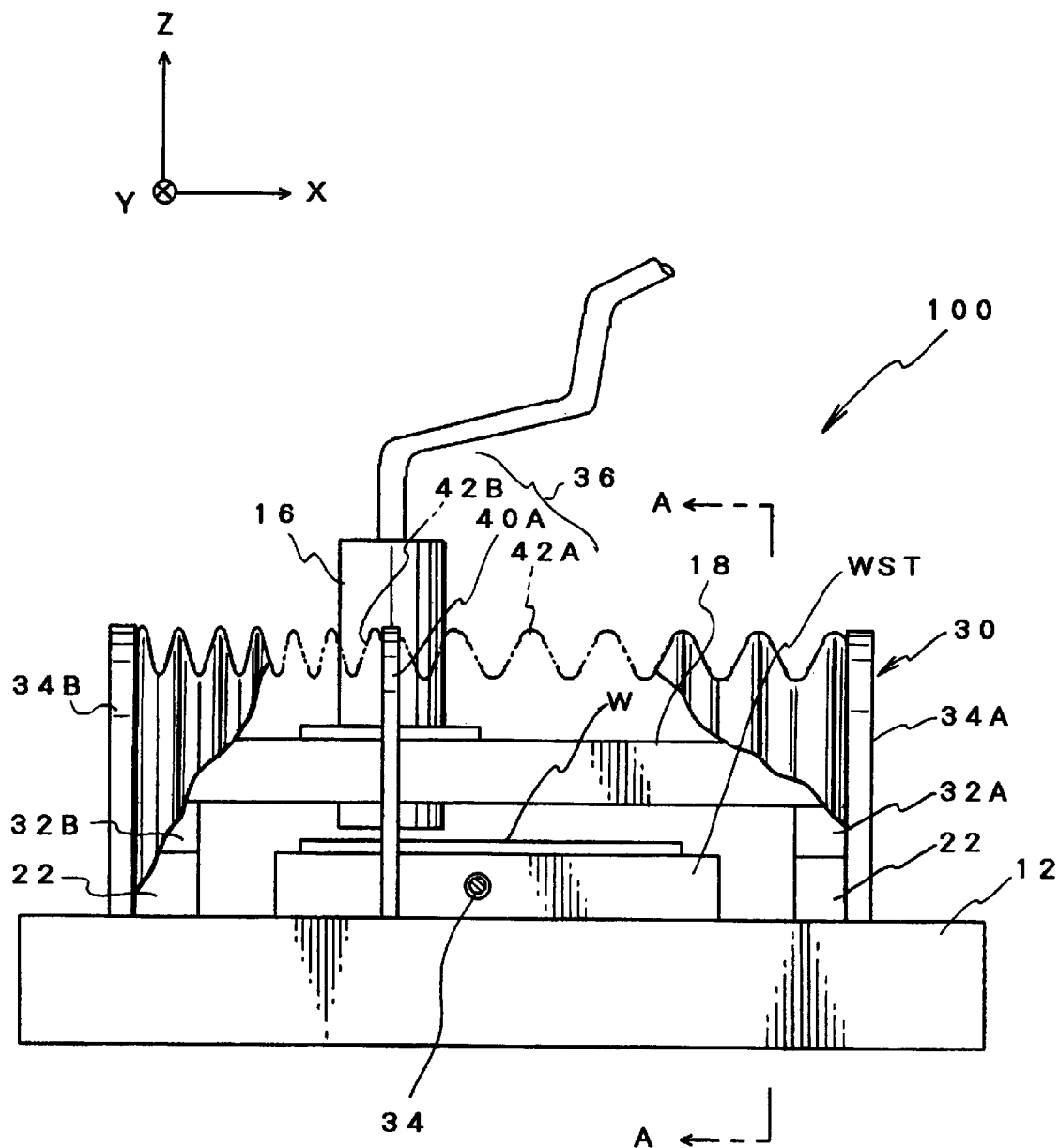
FIG. 6 illustrates a schematic configuration of the exposure apparatus of a second embodiment of the invention.

The exposure apparatus 100 of this second embodiment has, as shown in FIG. 6, a vacuum chamber 30 in place of the vacuum chamber 14 in the first embodiment, and is characterized in that the wafer stage WST is movable at a predetermined stroke (more specifically, about twice as large as the wafer W diameter) in the Y direction (first direction: direction perpendicular to the paper surface of FIG. 1).

In this exposure apparatus 100, as shown in FIG. 6, a pair of supporting members 32A and 32B extending in the Y axis direction are arranged on the surface plate 12 in the X axis direction (second direction: right-left direction in FIG. 6) at a predetermined interval, and an X guide 18 extending in the X direction is installed on these supporting members 32A and 32B. A pedestal on which an electron beam barrel 16 is arranged is formed by these X guide 18 and the supporting members 32A and 32B. The pedestal is supported on the surface plate 12 by a plurality of anti-vibration pads 22. The wafer stage WST is driven in the Y direction with a predetermined stroke by a feed screw mechanism having a feed screw.

The vacuum chamber 30 comprises a pair of side walls 34A and 34B made of semi-circular sheet members arranged outside the pair of holding members 32A and 32B on the upper surface of the surface plate 12, and a bellows-shaped portion 36 provided to form a closed space having a semi-circular cross-section between these side walls 34A and 34B. As shown in FIG. 7 giving a sectional view of FIG. 6 cut along the line A—A, the bellows-shaped portion 36 comprises a first ¼ arcuate reinforcing member 40A having an end connected to a side surface in the Y direction of the electron beam barrel 16, and the other end having a slider 38A; a ¼ arcuate second reinforcing member 40B having an end connected to the other side surface in the Y direction of the electron beam barrel 16 and the other end having a slider 38B; a first bellows member 42A connecting side surface on one side (right side in FIG. 6) in the X direction of the first and second reinforcing members 40A and 40B, the peripheral surface and a side wall 34A in the X direction of the electron beam barrel 16; and a second bellows portion 42B connecting the surfaces on the other side in the X direction of the first and second reinforcing members 40A and 40B and the side wall 34. The first and second bellows members 42A and 42B comprise bellows-shaped members expandable in the X direction.

Figure 7:
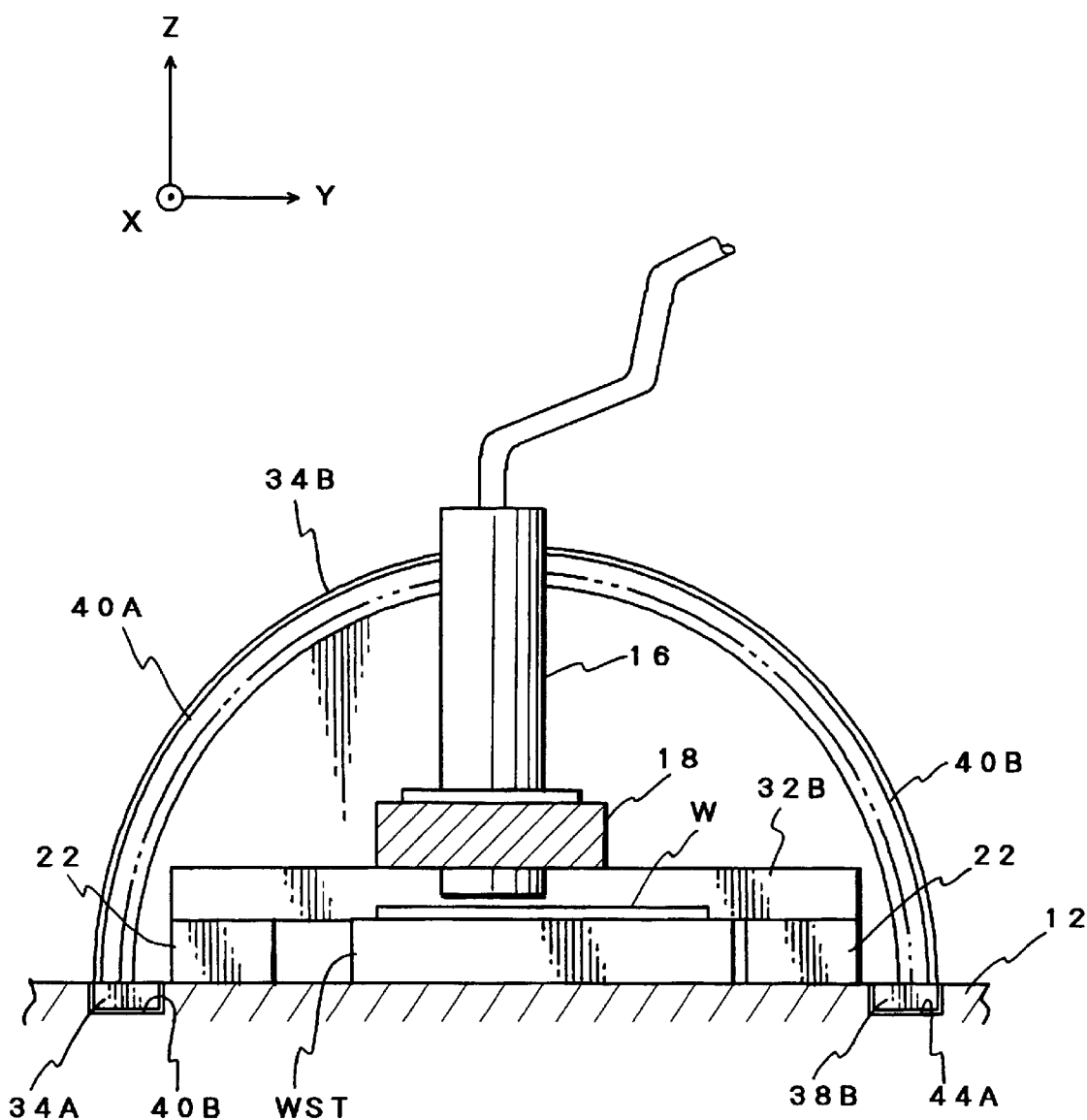
FIG. 7 is a sectional view of FIG. 6 cut along the line A—A.

As shown in FIG. 7, the sliders 38A and 38B are engaged with guide grooves 44A and 44B formed on the surface plate 12 in the X direction, and permanent magnets are built in the bottom surfaces and the Y-direction side surfaces of the sliders 38A and 38B. In match with this, permanent magnets extending in the X direction are built in the side walls in the Y direction of the guide grooves 44A and 44B. Coils are built in the inner bottoms of the guide grooves 44A and 44B in the X direction. These coils and the permanent magnets provided in the bottom surfaces of the slider 38A and 38B for moving magnet type linear motors, respectively. In this case, a clearance of several $\mu$m is provided between the sliders 38A, 38B and the guide grooves 44A, 44B. The inner space of the vacuum chamber 30 is kept to a predetermined degree of vacuum by constantly evacuating by means of a vacuum pump (not shown in Figs.).

The other parts are the same as those in the first embodiment described above.

In the exposure apparatus 100 of the second embodiment having the above-mentioned configuration, when performing exposure to a entire surface of the wafer W, the electron beam barrel 16 is moved in the X direction by the X linear motor and the pair of linear motors on the surface plate 12 under control by a control unit (not shown in Figs.), and simultaneously, the wafer stage WST is moved in the Y direction by the feed screw mechanism. In the exposure apparatus 100 of this embodiment, as described above, exposure of the entire surface of the wafer W is achieved through X movement of the electron beam barrel 16 and Y movement of the wafer stage WST. It is therefore possible to reduce the footprint to about a half as compared with the case of the wafer stage side making a two-dimensional movement. More specifically, for example when exposing a wafer having a diameter of 300 mm, two-dimensional movement of the wafer stage side requires an area of 600 mm square for the movement of the stage, whereas, in this embodiment, though requiring a moving stroke of the wafer stage WST in the Y direction of 600 mm, twice as large as the wafer diameter, a moving stroke of the electron beam barrel in the X direction of only 300 mm suffices. As a result, the moving stroke requires a footprint of only 300×600 mm, about a half that required in two-dimensional movement of the wafer stage side (about twice as large as that in the first embodiment).

In this case, the vacuum chamber 30 houses the wafer stage WST and a part of the electron beam barrel 16, and does not contain all the electron beam barrel 16. It is therefore possible to reduce the inner volume of the vacuum chamber 30, hence leading to an accordingly shorter evacuation time, and a smaller vacuum pump. Further, since a part of the vacuum chamber is composed of a bellows-shaped members (42A and 42B) expanding and contracting along with the movement of the electron beam barrel 16. X direction movement of the electron beam barrel 16 is thus never prevented.

When conducting mix-and-match with an optical exposure apparatus described previously by using a plurality of the exposure apparatus 100 of this embodiment, it is possible to inhibit the footprint increment, or the increment of the clean room area, from the conventional one to about a half.

By using the exposure apparatus and the exposure method of this embodiment, it is possible to manufacture a device having extra-fine patterns by the manufacturing method shown in FIGS. 4 and 5, as in the first embodiment shown above.

The various advantages available from the adoption of the low-acceleration type electron beam barrel 16, as described above, are also available as in the first embodiment.

The exposure apparatus 100 of this embodiment is manufacturable in the same manner as in the first embodiment, except that the vacuum chamber is formed by assembling the side walls 34A and 34B arranged outside the pair of holding members 32A and 32B on the upper surface of the surface plate 12 and the bellows-shaped members 36 provided between these side walls 34A and 34B.

While, in the exposure apparatus 100 of this embodiment, the electron beam barrel 16 moves in the X direction, the bellows-shaped portions 36 may be made expandable in two-dimensional directions to move the electron beam barrel 16 in XY two-dimensional directions.

<Third Embodiment>

A third embodiment of the invention will now be described with reference to FIG. 8. For the same components as in the first embodiment, the same reference numerals are used and the description thereof is omitted.

The exposure apparatus 150 of the third embodiment has a vacuum chamber 60 in place of the vacuum chamber 14 in the first embodiment, and is characterized in that the vacuum chamber 60, pedestals (18, 20A and 20B) of the electron beam barrel 16, and the surface plate 12 holding the wafer stage WST are independently supported by anti-vibration pads or vibration isolators.

Figure 8:
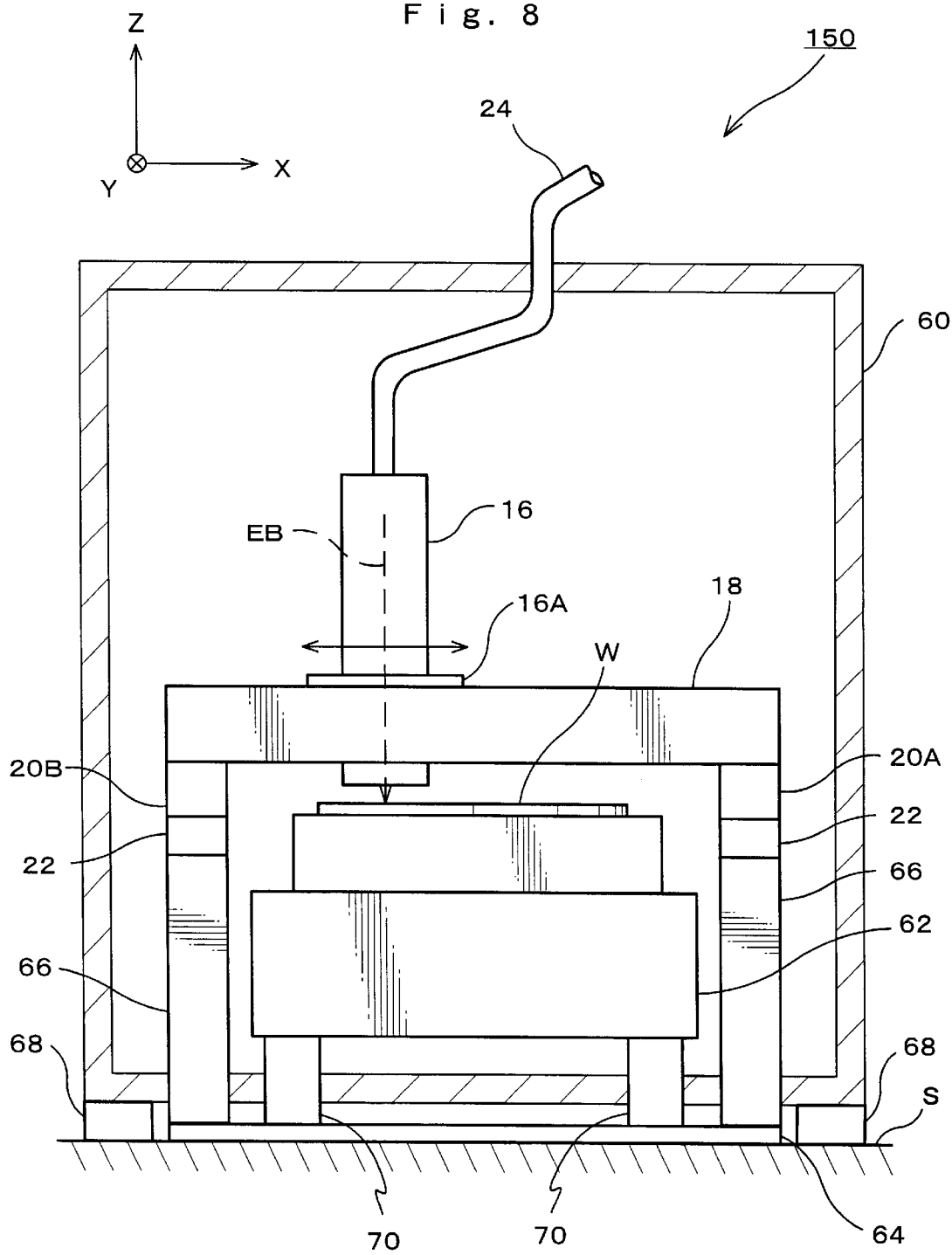
FIG. 8 illustrates a schematic configuration of the exposure apparatus of a third embodiment of the invention.

In this exposure apparatus 150, as shown in FIG. 8, the vacuum chamber 60 houses the electron beam barrel 16, the pedestals (18, 20A and 20B), the wafer stage WST and the surface plate 12, and supported by a plurality (four in this embodiment) anti-vibration pads 68 provided on the floor surface S. The pedestals (18, 20A and 20B) are held horizontal by anti-vibration pads 22 arranged on the upper surfaces of a plurality (four in this embodiment) struts 66 extending from the upper surface of the base plate arranged on the floor surface S upward through the lower wall of the vacuum chamber 60. The surface plate 12 is installed on the base plate 64 and held horizontal by a plurality (four in this embodiment) vibration isolators 70 running through the lower wall of the vacuum chamber 60. The vibration isolator 70 has the same configuration as that 11 in the first embodiment.

The other portions are the same as in the first embodiment, and the entire surface of the wafer W is exposed through XY two-dimensional movement of the electron beam barrel 16 as in the first embodiment. Therefore, it is possible to reduce the footprint to about a fourth that required in the two-dimensional movement of the wafer stage WST side.

When conducting mix-and-match with an optical exposure apparatus as described above by using a plurality of the exposure apparatuses 150 of this embodiment, the increment of the footprint, or the increment of the clean room area, can be reduced to about a fourth that conventionally required.

By using the exposure apparatus and the exposure method of this embodiment, it is possible to manufacture a device containing extra-fine patterns by the manufacturing method shown in FIGS. 4 and 5, as in the above-mentioned first embodiment.

The various advantages available by adopting the low-acceleration type electron beam barrel 16 as described above are also available as in the first embodiment.

In this embodiment, the vacuum chamber 60, the pedestals (18, 20A and 20B) of the electron beam barrel 16, and the surface plate 12 supporting the wafer stage WST are independently supported by anti-vibration pads 68 and 22 or the vibration isolators 70. The vacuum chamber 60, the electron beam barrel 16 and the wafer state WST are isolated from vibration travelling from outside through the floor surface. The wafer stage WST and the vacuum chamber 60 are isolated from vibration produced by the movement of the electron beam barrel 16 on a micro G level. It is therefore possible to accomplish highly accurate pattern transfer, and to improve the throughput of exposure operation, with a shorter settling time of positioning.

The exposure apparatus 150 of this embodiment is manufacturable in the same manner as in the first embodiment described above, except that the vacuum chamber 60 houses the electron beam barrel 16, the pedestals (18, 20A and 20B), the wafer stage WST, and the surface plate 12, and the vacuum chamber 60 is supported by a plurality (four in this embodiment) anti-vibration pads provided on the floor surface S, and the pedestals (18, 20A and 20B) are held horizontal by anti-vibration pads 22 arranged on the upper surface of struts 66, and the surface plate 12 is held horizontal by a vibration isolator 70.

The same variations as in the above-mentioned first embodiment can be made also in this embodiment.

In this embodiment, the wafer stage WST may be made movable in a predetermined direction by a predetermined distance for replacement of the wafer W. In this case, a higher degree of freedom is available regarding the arrangement of a wafer transfer mechanism and the moving mechanism of the electron beam barrel 16.

Variation from the first embodiment to the third embodiment can be made a also to the second embodiment.

In the embodiment, the case of application of the invention to the electron beam m exposure apparatus has been described. The scope of the invention is not however limited to this, but the invention is suitably applicable to an exposure apparatus having a charged particle beam barrel such as an ion beam exposure apparatus. When using a charged particle beam other than electron beam, the acceleration voltage of the charged particle beam depends upon the kind of charged particle, kind of resist material, and the film thickness of resist.

As described above, the exposure apparatus and the exposure method of the present invention is suitable for forming extra-fine patterns on a substrate such as a wafer at a high accuracy in the lithographic process for manufacturing microdevices such as integrated circuits.

The manufacturing method of devices of the invention is suitable for manufacturing devices having extra-fine patterns, and the device of the invention is suitable for the manufacture of apparatuses requiring a very high degree of integrity or a very high pattern accuracy.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention which is best defined by the claims appended below.

What is claimed is:

1. An exposure apparatus comprising:
   a substrate holder holding a substrate;
   a charged particle beam barrel movable within a predetermined plane parallel to a surface of said substrate for exposing said substrate by irradiating a charged particle beam onto said substrate, and
   a measurement unit which obtains information related to a tilt of said enlarged particle beam barrel with respect to said predetermined plane.

2. An exposure apparatus according to claim 1, further comprising a vacuum chamber which houses at least a part of said charged particle beam barrel and said substrate holder.

3. An exposure apparatus according to claim 1, wherein said charged particle beam exposes a two-dimensional region on said substrate.

4. An exposure apparatus according to claim 3, wherein said charged particle beam barrel moves over an entire exposure range on said substrate.

5. An exposure apparatus according to claim 3, wherein said substrate holder is movable, and said charged particle beam is irradiated onto an entire exposure range on said substrate by moving said charged particle beam barrel and said substrate holder.

6. An exposure apparatus according to claim 5, further comprising:
   a base on which said substrate holder is placed; and
   a vibration isolator on which said base is arranged.

7. An exposure apparatus according to claim 3, wherein said substrate holder is movable in a first direction, and said charged particle beam barrel is movable in a second direction perpendicular to said first direction within said predetermined plane parallel to the surface of said substrate.

8. An exposure apparatus according to claim 7, further comprising a vacuum chamber which houses said substrate holder and a part of said charged particle beam barrel, and a part of said vacuum chamber includes a bellows-type member which expands and contracts in response to movement of said charged particle beam barrel.

9. An exposure apparatus according to claim 1, further comprising:
   a pedestal on which said charged particle beam barrel is arranged; and
   a vibration attenuator arranged between said pedestal and an installation surface of said substrate holder.

10. An exposure apparatus according to claim 9, wherein said vibration attenuator is arranged on said installation surface, and has a first vibration isolator which supports said pedestal.

11. An exposure apparatus according to claim 10, further comprising a second vibration isolator on which said substrate holder is arranged, and
   said first vibration isolator is arranged on a same plane as the installation surface of said second vibration attenuator.

12. An exposure apparatus according to claim 11, further comprising a vacuum chamber which houses at least a part of said charged particle beam barrel and said substrate holder, and
   the installation surface of said substrate holder and an installation surface of said vacuum chamber are different from each other.

13. An exposure apparatus according to claim 1, further comprising:
   a pedestal on which said charged particle beam barrel is arranged; and
   a vibration attenuator, connected to said pedestal and offsetting a reaction force produced in said pedestal with movement of said charged particle beam barrel.

14. An exposure apparatus according to claim 13, wherein said vibration attenuator has a structure movable in response to movement of said charged particle beam barrel.

15. An exposure apparatus according to claim 14, wherein said pedestal is installed on a base on which said substrate holder is arranged.

16. An exposure apparatus according to claim 13, further comprising a vibration isolator on which said substrate holder is arranged; and
   said vibration attenuator is arranged on substantially a same plane as an installation surface of said vibration isolator, and has an actuator having an end secured to said pedestal.

17. An exposure apparatus according to claims 16, wherein said pedestal is installed on a base on which said substrate holder is arranged.

18. An exposure apparatus according to claim 1, wherein said charged particle beam barrel is an electron beam barrel which irradiates an electron beam onto said substrate.

19. An exposure apparatus according to claim 18, wherein an acceleration voltage of said electron beam is at least 500V and under 30 kV.

20. An exposure apparatus according to claim 19, wherein the acceleration voltage of said electron beam is at least 5 kV and under 20 kV.

21. An exposure apparatus according to claim 18, wherein said electron beam barrel is one selected from the group consisting of Gaussian beam type, various forming beam type, cell projection type, blanking aperture array type, and electron beam projecting system type.

22. An exposure apparatus according to claim 18, wherein said electron beam barrel is one selected from the group consisting of arbitrary combination of any of Gaussian beam type, various forming beam type, cell projection type, blanking aperture array type, and electron beam projecting system type.

23. An exposure apparatus according to claim 1, wherein rotation of said charged particle beam barrel in said predetermined plane is detected.

24. A manufacturing method of a device comprising a lithographic process, wherein
   said lithographic process uses the exposure apparatus according to claim 1.

25. An exposure apparatus according to claim 1, wherein said charged particle beam barrel moves along at least one of a first axis and a second axis that are perpendicular within said predetermined plane, and said obtained information is used to adjust a positional relationship between said charged particle beam and said substrate.

26. An exposure apparatus according to claim 25, wherein said measurement unit obtains information related to rotation of said charged particle beam barrel around each axis of said first axis and said second axis.

27. An exposure apparatus according to claim 26, wherein said measurement unit includes an interferometer system which detects a positional information of said charged particle beam barrel within said predetermined plane and said information related to rotation, and movement of said charged particle beam barrel is controlled based on at least said positional information.

28. A method of making an exposure apparatus, comprising:
   providing a substrate holder holding a substrate;
   providing a charged particle beam barrel movable within a predetermined plane parallel to a surface of said substrate for exposing said substrate by irradiating a charged particle beam onto said substrate; and
   providing a measurement unit which obtains information related to a tilt of said charged particle beam barrel with respect to said predetermined plane.

29. A method according to claims 28, further comprising:
   providing a vacuum chamber which houses said substrate holder and said charged particle beam barrel.

30. A method according to claims 28, further comprising:
   providing a pedestal on which said charged particle beam barrel is arranged, and a vibration attenuator arranged between said pedestal and a supporting member of said substrate holder.

31. An method of exposing a substrate by the use of a charged particle beam, comprising:
   moving a charged particle beam barrel which irradiates said charged particle beam onto said substrate to expose a predetermined area of said substrate with said charged particle beam; and
   obtaining information related to measurement of a tilt of said charged particle beam barrel with respect to a predetermined plane parallel to a surface of said substrate.

32. An method according to claim 31, wherein, during exposure of said substrate, said charged particle beam barrel is moved in the two-dimensional directions relative to said substrate while substantially fixing said substrate.

33. An method according to claim 31, wherein, during exposure of said substrate, said substrate is moved in a first direction, and said charged particle beam barrel is moved at least in a second direction perpendicular to said first direction within said predetermined plane parallel to the surface of said substrate relative to said substrate.

34. A device manufactured by using the exposure method according to claim 31.

35. A method according to claim 31, further comprising:
   adjusting a positional relationship between said charged particle beam and said substrate based on said obtained information.

36. A method according to claim 35, wherein
said charged particle beam barrel moves along at least one of a first axis and a second axis that are perpendicular within said predetermined plane, and said obtained information includes information related to rotation of said charged particle beam barrel around each axis of said first axis and said second axis.

37. A method according to claim 36, wherein said information related to rotation and positional information on said charged particle beam barrel within in said predetermined plane is measured with an interferometer system, and movement of said charged particle beam barrel is controlled based on at least said positional information.

* * * * *